US012674821B2

(12) United States Patent
Spitzer et al.

(10) Patent No.: US 12,674,821 B2
(45) Date of Patent: Jul. 7, 2026

(54) CURRENT SENSOR DEVICE WITH AN ELECTRIC CONDUCTOR AND A MAGNETIC SENSOR BEING SPATIALLY SEPARATED FROM THE ELECTRIC CONDUCTOR

(71) Applicant: Infineon Technologies AG, Neubiberg (DE)

(72) Inventors: Dietmar Spitzer, Völkermarkt (AT);
Gaetano Formato, Villach (AT);
Giampiero Ciammetti, Villach (AT);
Takeshi Wakii, Yokohama (JP)

(73) Assignee: Infineon Technologies AG, Neubiberg (DE)

( * ) Notice: Subject to any disclaimer, the term of this patent is extended or adjusted under 35 U.S.C. 154(b) by 92 days.

(21) Appl. No.: 18/431,502

(22) Filed: Feb. 2, 2024

(65) Prior Publication Data

US 2024/0264205 A1    Aug. 8, 2024

(30) Foreign Application Priority Data

Feb. 3, 2023    (DE) .......................... 102023200901.3

(51) Int. Cl.
*G01R 15/20*        (2006.01)
*G01R 19/00*        (2006.01)

(52) U.S. Cl.
CPC ....... *G01R 15/202* (2013.01); *G01R 19/0092* (2013.01)

(58) Field of Classification Search
CPC . G01R 15/202; G01R 15/207; G01R 19/0092
See application file for complete search history.

(56) References Cited

U.S. PATENT DOCUMENTS

| | | | | |
|---|---|---|---|---|
| 5,041,780 A | * | 8/1991 | Rippel | ................ G01R 15/207 |
| | | | | 324/251 |
| 11,747,369 B2 | * | 9/2023 | Houis | ................ G01R 15/202 |
| | | | | 324/252 |
| 2011/0270553 A1 | * | 11/2011 | Ausserlechner | ..... G01R 15/202 |
| | | | | 702/183 |
| 2015/0137807 A1 | * | 5/2015 | Hu | ........................ G01R 33/302 |
| | | | | 324/322 |

(Continued)

FOREIGN PATENT DOCUMENTS

| | | | |
|---|---|---|---|
| EP | 2264471 B1 | | 12/2018 |
| JP | 2013044705 A | * | 3/2013 |

(Continued)

*Primary Examiner* — Dominic E Hawkins
(74) *Attorney, Agent, or Firm* — Harrity & Harrity, LLP

(57) ABSTRACT

This disclosure concerns a sensor device including an electric conductor including a flat elongated shape. The electric conductor includes at least one cutout portion extending along the width of the electric conductor (200), the cutout portion extending from a first longitudinal side of the electric conductor towards an opposite second longitudinal side of the electric conductor, wherein a residual portion of the electric conductor remains between the cutout portion and the second longitudinal side of the electric conductor. A magnetic sensor is provided for measuring a magnetic field emanating from the electric current flowing through the electric conductor, wherein the magnetic sensor is arranged next to the electric conductor opposite the cutout portion.

20 Claims, 18 Drawing Sheets

(56) References Cited

U.S. PATENT DOCUMENTS

| | | | | |
|---|---|---|---|---|
| 2018/0003742 A1* | 1/2018 | Shimizu | ............... | G01R 15/207 |
| 2018/0038896 A1* | 2/2018 | Sakaguchi | ........... | G01R 15/146 |
| 2019/0025350 A1* | 1/2019 | Fukuhara | ............... | G01R 33/07 |
| 2019/0212371 A1* | 7/2019 | Racz | .................... | G01R 15/202 |
| 2019/0361055 A1 | 11/2019 | Hebeguchi et al. | | |
| 2021/0041485 A1* | 2/2021 | Hammerschmidt | . | G01R 15/207 |
| 2022/0018880 A1 | 1/2022 | Houis | | |
| 2022/0091161 A1* | 3/2022 | Houis | .................. | G01R 15/207 |
| 2023/0071087 A1* | 3/2023 | Vuillermet | ........... | G01R 15/207 |
| 2023/0298779 A1* | 9/2023 | Messier | .................. | H01B 5/02 |
| | | | | 324/114 |

FOREIGN PATENT DOCUMENTS

| | | | |
|---|---|---|---|
| JP | 2018185225 A1 | 11/2018 | |
| WO | 2018163685 A | 9/2018 | |

* cited by examiner

CURRENT SENSOR DEVICE WITH AN ELECTRIC CONDUCTOR AND A MAGNETIC SENSOR BEING SPATIALLY SEPARATED FROM THE ELECTRIC CONDUCTOR

CROSS-REFERENCE TO RELATED APPLICATION

This application claims priority to German Patent Application No. 102023200901.3 filed on Feb. 3, 2023, the content of which is incorporated by reference herein in its entirety.

TECHNICAL FIELD

Implementations of the present disclosure relate to electric current sensor devices, and in particular to a sensor device comprising an electric conductor and a magnetic sensor for measuring a magnetic field that is created by an electric current flowing through the electric conductor.

BACKGROUND

Electric current sensing is a fast growing application field covering a wide range of applications. A key driver for growth is the electrification of automotive drives but also drives for industry. For high current applications, and/or for applications that require a galvanic isolation between the conductor carrying the test current and the current sensor output, magnetic current sensors are widely used. Magnetic current sensors can sense the test current indirectly by measuring the magnetic flux density that is created by the test current.

Traditional implementations of magnetic current sensors utilize a ferrous core (field concentrator) that is wrapped around the conductor carrying the test current. The flux density in the field concentrator is proportional to the test current according to equation:

$$Br=\mu_0{}^*\mu_r{}^*I_{test}.$$

The relative permeability u, of the iron core therefore performs an amplification of the flux density. A linear field probe (e.g., a linear hall sensor) measures the flux produced by the test current and therefore provides a galvanically isolated output signal representing the test current. Other implementations of core-based sensors compensate the flux density produced by the test current via a compensation winding. In this case, the field probe is required to control the resulting flux density to a constant value (e.g., zero), while the compensation current is proportional to the test current.

While the basic construction of core-based sensors is relatively simple, these implementations have several drawbacks. For example, core-based sensors are quite bulky resulting in an enlarged size which is inevitably connected with increased cost and weight of the magnetic core. Furthermore, they are prone to non-linearity errors caused by saturation effects of the relative permeability $\mu_r$. Yet further, they show offset errors caused by remanence effects of the core.

In contrast, coreless current sensors operate without the use of field concentrators. Different to the above core-based implementations, these coreless sensors may directly measure the flux density produced by the test current. By avoiding an iron core, all drawbacks listed before can be omitted. However, the available flux density at the sensitive elements is significantly reduced. Therefore, the sensitive elements need to be placed as close as possible to the conductor.

SUMMARY

Therefore, it is desirable to provide a sensor device that challenges the above mentioned drawbacks. This goal is achieved using the herein disclosed sensor device according to the independent claims. Further implementations and advantageous aspects are suggested in the dependent claims.

According to the herein described innovative concept, a sensor device is provided, the sensor device comprising an electric conductor comprising a flat elongated shape having a thickness, a width and a length, wherein the electric conductor is configured to conduct an electric current along its length. The electric conductor comprises at least one cutout portion extending along the width of the electric conductor. The cutout portion extends from a first longitudinal side of the electric conductor towards an opposite second longitudinal side of the electric conductor. A residual portion of the electric conductor remains between the cutout portion and the second longitudinal side of the electric conductor. This residual portion forms a narrowed section that has to be passed by an electric current when flowing through the electric conductor. Accordingly, the electric current density is increased at this narrowed residual portion, resulting in an increased flux density of the magnetic field emanating from the flowing electric current. The sensor device further comprises a magnetic sensor for measuring the magnetic field emanating from the electric current flowing through the electric conductor, wherein the magnetic sensor device is arranged next to the electric conductor, at the second longitudinal side opposite the cutout portion.

BRIEF DESCRIPTION OF THE DRAWINGS

In the following, implementations of the present disclosure are described in more detail with reference to the figures, in which.

DETAILED DESCRIPTION

Figures 1A, 1B, 1C, 1D:
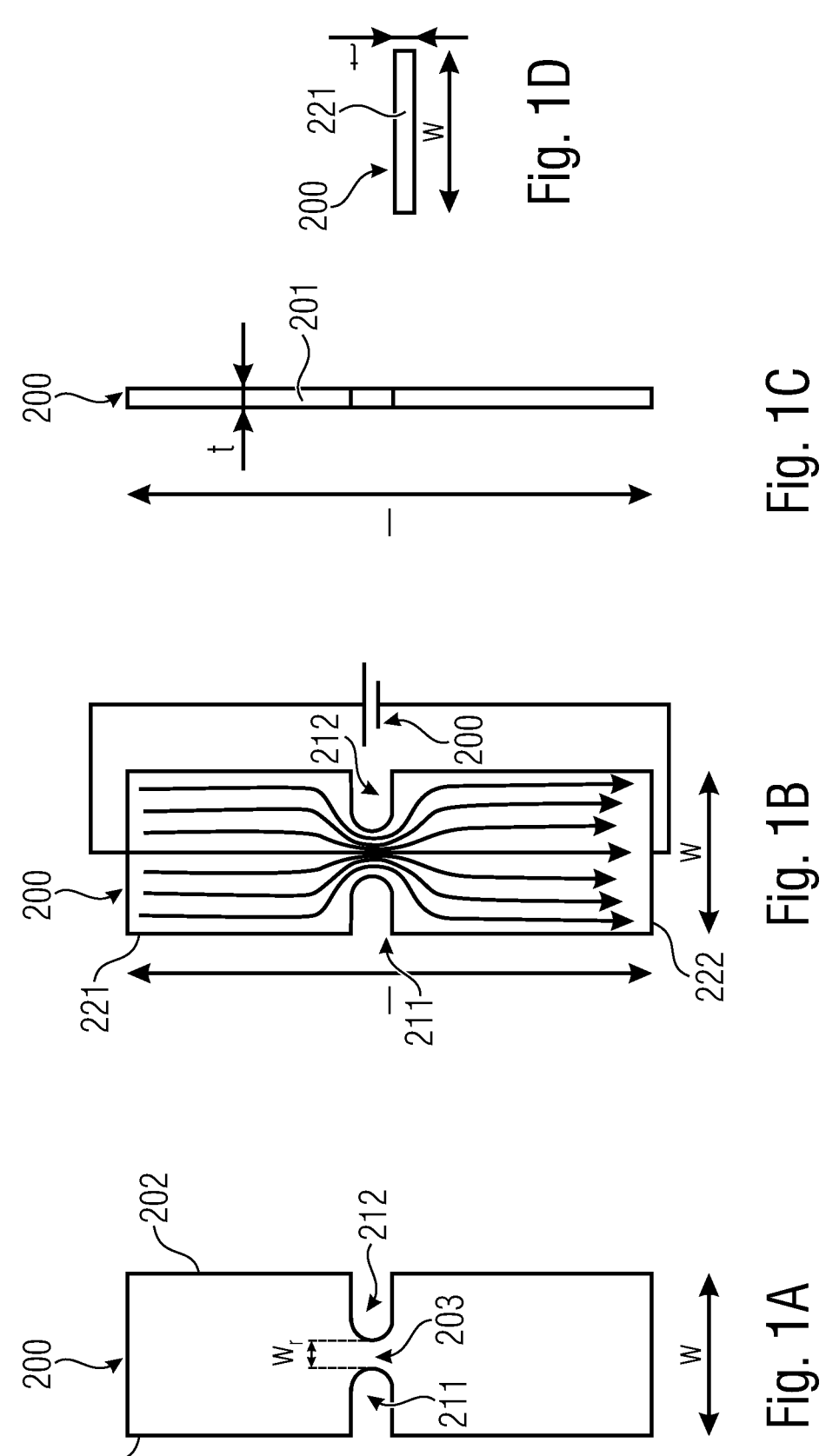
FIG. 1A shows a schematic top view onto an electric conductor that can be used in the context of the innovative sensor device.
FIG. 1B shows the same electric conductor in case an electric current flows through the conductor.
FIG. 1C shows a schematic side view of the electric conductor.
FIG. 1D shows a schematic front view of the electric conductor.

In the following figures, equal or equivalent elements or elements with equal or equivalent functionality are denoted in the following description by equal or equivalent reference numerals.

FIGS. 1A to 1D show an electric conductor 200 as it can be used in the context of the herein presented innovative sensor device. FIG. 1A shows a top view onto the electric conductor 200. The electric conductor 200 comprises a length denoted with lower case letter l, and a width denoted with lower case letter w. The width w is perpendicular to the length l.

The electric conductor 200 comprises a first longitudinal side 201 and an opposite second longitudinal side 202. Both longitudinal sides 201, 202 extend along a length direction of the electric conductor 200.

The electric conductor 200 may comprise a first cutout portion 211 that is formed in the first longitudinal side 201, and a second cutout portion 212 that is formed in the second longitudinal side 202. Both cutout portions 211, 212 may extend in the width direction, e.g., perpendicular to the length direction of the electric conductor 200. In particular, the first cutout portion 211 may extend from the first longitudinal side 201 towards the opposite second longitudinal side 202, thereby reaching inwards into a mid section of the electric conductor 200. The second cutout portion 212 may extend from the second longitudinal side 202 towards the opposite first longitudinal side 201, thereby also reaching inwards into a mid section of the electric conductor 200.

Both cutout portions 211, 212 may not reach up to the center of the electric conductor 200, e.g., they do not touch each other in the middle, but a residual portion 203 of the electric conductor 200 remains between the two cutout portions 211, 212. Accordingly, the residual portion 203 forms a narrowed section in the electric conductor 200, the narrowed section comprising a reduced width w, compared to the regular width w of the electric conductor 200.

FIG. 1B shows a schematic view of an electric current flowing through the electric conductor 200 in its length direction, wherein the electric current is represented using the arrows inside the electric conductor 200. For example, a power source 220 may be connected to the lateral end portions 221, 222 of the electric conductor 200. As can be seen, the electric current has to pass the narrowed section between the two cutout portions 211, 212. Thus, the electric current aggregates at the narrowed residual portion 203 formed between the two cutout portions 211, 212. Accordingly, the electric current density is increased at the narrowed residual portion 203. The electric current produces a magnetic field, wherein the magnetic flux density is proportional to the electric current density. Thus, the magnetic flux density also increases at the narrowed residual portion 203. This magnetic flux may be measured with a magnetic sensor, as will be explained in more detail in the following with reference to the subsequent figures.

Meanwhile, for the sake of completeness, FIG. 1C shows a side view of the first longitudinal side 201 of the electric conductor 200, and FIG. 1D shows a front view of the first lateral end portion 221. As can be seen, the electric conductor 200 comprises a thickness denoted with lower case letter t. The thickness t is perpendicular to the length l and perpendicular to the width w. The thickness t is significantly smaller than the length l and the width w of the electric conductor 200. Accordingly, the electric conductor 200 comprises a geometric strip-like shape or a bar shape. These types of electric conductors 200 may also be referred to as current rails or busbars. A busbar may be used for distributing electric power into a plurality of branches branching off from the busbar.

In particular, busbars may be used in high voltage/high current applications. All of the herein described electric conductors 200 that can be used in context with the present innovative concept, may be suitable to conduct voltages of 500 V and more, and to conduct electric currents of 100 A and more. Despite these high electrical voltages and currents, the electric conductors 200 according to the present innovative concept may comprise dimensions (length, width, thickness) in the range of millimeters. For example, according to some implementations, the electric conductor 200 may comprise a width w between 10 mm and 60 mm, and/or a thickness t between 2 mm and 8 mm.

Figure 2A:
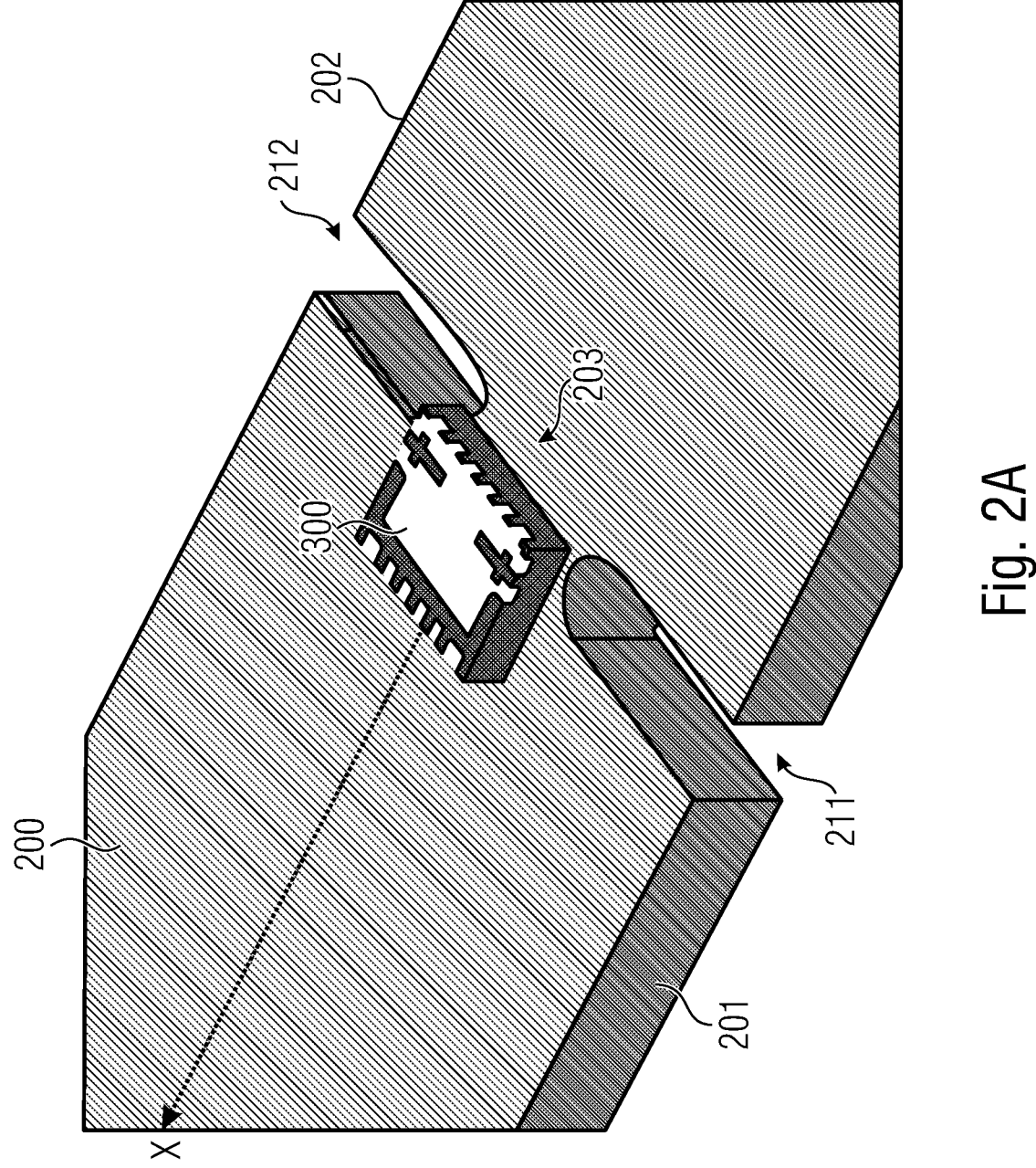
FIG. 2A shows a schematic perspective view of a "lateral insertion" current sensor arrangement.
Figure 2B:
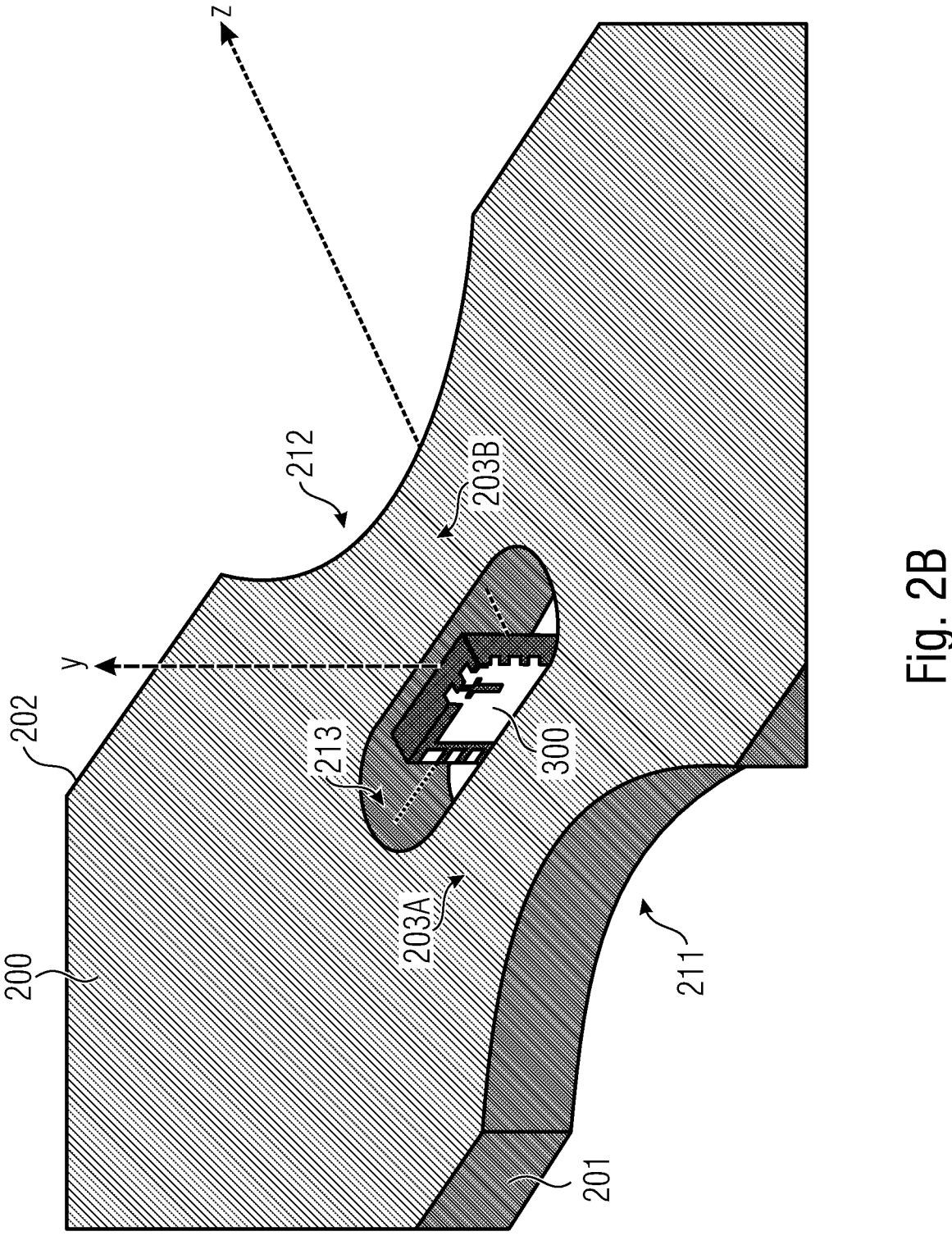
FIG. 2B shows a schematic perspective view of a "vertical insertion" current sensor arrangement.

FIGS. 2A and 2B show conventional current sensor arrangements for measuring an electric current using a magnetic sensor 300. FIG. 2A shows an arrangement that is referred to as "lateral insertion", while FIG. 2B shows an arrangement that is referred to as "vertical insertion", wherein the naming is owed to the positional relationship between the magnetic sensor 300 and the above described narrowed residual portion 203.

As can be seen in FIG. 2B, a third cutout portion 213 is formed between the first and second cutout portions 211, 212. Accordingly, the electric conductor 200 comprises two narrowed residual portions 203A, 203B. A first narrowed residual portion 203A is provided between the first cutout portion 211 and the third cutout portion 213, while a second narrowed portion 203B is provided between the second cutout portion 212 and the third cutout portion 213.

In FIG. 2B, a magnetic sensor 300 is vertically inserted inside the third cutout portion 213. The magnetic sensor 300 measures the magnetic field emanating from the electric current in the depicted z-direction. Accordingly, the magnetic sensor 300 may be capable of measuring the magnetic flux at the first narrowed residual portion 203A and at the second narrowed residual portion 203B simultaneously. Therefore, this arrangement is referred to as "vertical insertion".

In FIG. 2A, the magnetic sensor 300 is positioned horizontally at the narrowed residual portion 203. Thereby, it can measure the magnetic flux in a lateral direction (e.g., in the depicted x-direction) at the narrowed residual portion 203. Therefore, this arrangement is referred to as "lateral insertion".

In case of high power inverter platforms, the cross section of these conventional electric conductors 200 at the measurement point (where the sensor is positioned) needs to be big, in order to achieve a desirable "insertion resistance" that is as low as possible. The "insertion resistance" is defined as the resistance caused by the one or more cutout portions 211, 212, 213 being provided in the electric conductor 200, which leads to a power loss at the narrowed residual portions(s) 203A, 203B that shall be as low as possible to avoid overheating of the sensor IC and the electric conductor 200 in that area. Therefore, it is desirable that the insertion resistance is kept as low as possible. For example, regarding electric conductors 200 having the herein disclosed dimensions, an insertion resistance of 5 μOhm or less may be advantageous. To reach this result, big busbar thicknesses have to be used (~3 mm) and the conductor width at the measurement point has to be increased to 5 mm or more.

However, in case of the above discussed conventional sensing structures known as "lateral insertion" and "vertical insertion", an increase of the conductor width at the measurement point, in combination with a bigger busbar thickness, leads to an increase of the phase shift and to an attenuation of the magnitude over frequency introduced by the sensing structure on the current measurement.

In other words, for high power applications, the size of the busbar 200 needs to be increased in order to reach a desired resistance value. However, an increased busbar size leads to an undesired increase in phase shift and magnitude attenuation.

Therefore, solutions have to be found for providing electric conductors (busbars) 200 having an insertion resistance that is as low as possible (e.g., 5 Ohm or less), but at the same comprising small dimensions such that a phase shift remains small (e.g., 4° or less) and an attenuation of the magnitude stays at or below an acceptable level.

The authors of this disclosure found a solution for this trade-off, which shall be discussed in the following with reference to the following figures. The scale that is drawn in these Figures may only refer to the depicted non-limiting examples and implementations in order to provide a rough approximate information of some possible measures. Thus, the scale is not to be construed as limiting in any way.

Figure 3A:
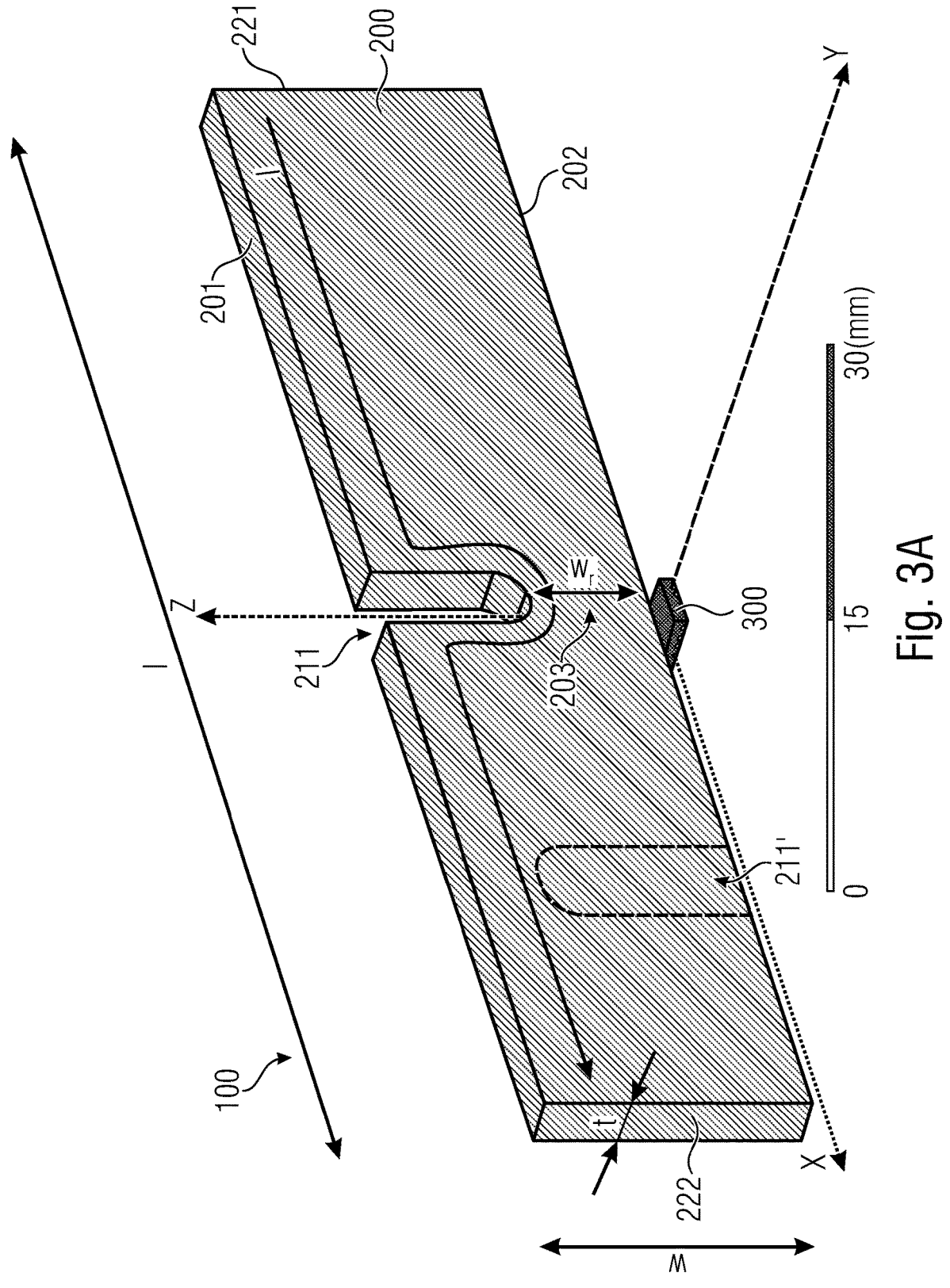
FIG. 3A shows a perspective view of a sensor device according to an implementation.

FIG. 3A shows a sensor device 100 according to an implementation of the herein described innovative concept. The sensor device 100 comprises an electric conductor (e.g., a busbar) 200 comprising a flat elongated bar-like or strip-like shape having a thickness t, a width w and a length l, as discussed above.

Furthermore, the electric conductor 200 is configured to conduct an electric current along its length l, which is exemplarily depicted using the curved arrow denoted with uppercase letter I. For example, as mentioned above, an electric power source (not depicted) may be connected to the lateral end portions 221, 222 of the electric conductor 200. Depending on the power source's polarity, the electric current I may flow either in one direction or the other.

The electric conductor 200 comprises a cutout portion 211 extending along the width (e.g., in the width direction) of the electric conductor 200. For example, the cutout portion 211 may extend into a direction that is perpendicular to the direction of flow of the electric current I. Thus, if the electric current I flows along the length of the electric conductor 200, then the cutout portion 211 may extend substantially perpendicular thereto, e.g., along the width of the electric conductor 200.

The cutout portion 211 is formed into one of the two longitudinal sides 201, 202 of the electric conductor 200. In particular, the cutout portion 211 may be formed into exactly one of the two longitudinal sides 201, 202 of the electric conductor 200. In other words, the cutout portion 211 may be provided as a single-sided cutout portion, which means that it is formed into one of the lateral sides 201, 202 of the electric conductor 200 only.

At the opposite lateral side, in an area that directly faces the cutout portion 211, the opposite lateral side does not comprise any further cutout portions. In turn, in areas where the opposite lateral side does not directly face the cutout portion 211, one or more additional single-sided cutout portions may be provided in the opposite lateral side, such as exemplarily depicted using the cutout portion 211' drawn in dashed lines.

In the example depicted in FIG. 3A, the single-sided cutout portion 211 may be formed into the first lateral side 201 only. In an area directly facing the cutout portion 211, the opposite second lateral side 202 does not comprise any further cutout portions. Of course, the single-sided cutout portion 211 may be provided in either one of the first and second lateral sides 201, 202.

Stated in more general terms, if the single-sided cutout portion 211 is provided in exactly one of the lateral sides 201, 202 of the electric conductor 200, then an area of the opposite lateral side, which is directly opposite to the cutout portion 211 and which faces the cutout portion 211, does not comprise a cutout portion.

The electric conductor 200 may comprise a plurality of such single-sided cutout portions 211 which may be distributed along the length of the electric conductor 200 while being laterally (along the length direction) spaced apart from each other, as exemplarily shown by the two cutout portions 211, 211'. The second cutout portion 211' is exemplarily formed into the second lateral side 202 of the electric conductor 200. However, it may also be formed into the first lateral side 201 of the electric conductor 200. Accordingly, a plurality of laterally spaced single-sided cutout portions 211, 211' may be formed into the first lateral side 201 and/or into the second lateral side 202 of the electric conductor 200.

Furthermore, it can be seen that the single-sided cutout portion 211 extends from the first longitudinal side 211 of the electric conductor 200 towards the opposite second longitudinal side 202 of the electric conductor 200. However, the single-sided cutout portion 211 does not reach up to the second longitudinal side 202. Thus, a residual portion 203 of the electric conductor 200 remains between the cutout portion 211 and the opposite second longitudinal side 202 of the electric conductor 200.

The residual portion 203 forms a narrowed section in the electric conductor 200. The residual portion 203 comprises a residual width w, that is smaller than the remaining average width w of the electric conductor 200.

As explained above, when the electric current passes the narrowed residual portion 203, the current aggregates at the narrowed residual portion 203, thereby increasing the electric current density and the corresponding magnetic flux density. Accordingly, the magnetic flux density is increased at the narrowed residual portion 203.

For measuring the magnetic field emanating from the electric current flowing through the narrowed residual portion 203 of the electric conductor 200, a magnetic sensor 300 is provided. The magnetic sensor 300 is arranged next to the electric conductor 200, and the magnetic sensor 300 is positioned opposite the cutout portion 211, such that the magnetic sensor 300 faces the residual portion 203 and the cutout portion 211.

In particular, the magnetic sensor 300 is arranged at that one lateral side of the electric conductor 200 in which the cutout portion 211 is not formed. In the example depicted in FIG. 3A, the cutout portion 211 is formed into the first lateral side 201, and thus the magnetic sensor 300 is arranged at the opposite second longitudinal side 202. In other words, the magnetic sensor 300 is arranged such that the residual portion 203 is positioned between the magnetic sensor 300 and the cutout portion 211.

Figures 3B, 3C:
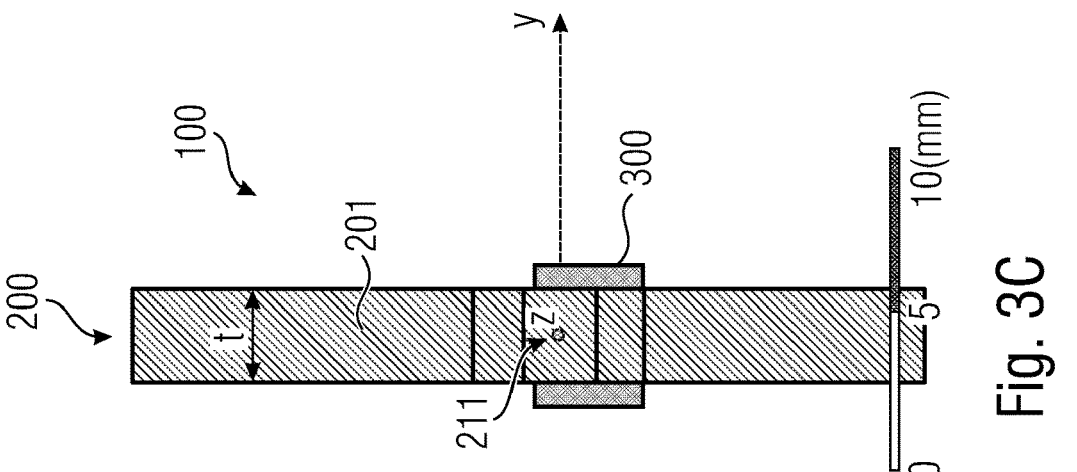
FIG. 3B shows a top view onto a section of the sensor device of FIG. 3A.
FIG. 3C shows a side view of a section of the sensor device of FIG. 3A.

FIG. 3B shows a top view onto a section of the electric conductor 200. As can be seen, the magnetic sensor 300 is arranged such that it faces the residual portion 203 and the cutout portion 211, wherein the residual portion 203 is positioned between the magnetic sensor 300 and the cutout portion 211.

The magnetic sensor 300 may be spatially separated from the electric conductor 200. In this example, the magnetic sensor 300 may be spatially separated from the second longitudinal side 202 of the electric conductor 200. Accordingly, an air gap 'AG' remains between the magnetic sensor 300 and the second longitudinal side 202 of the electric conductor 200. The air gap AG may comprise dimensions between 0.1 mm and 1.5 mm (e.g., 0.8 mm). Thus, the magnetic sensor 300 may be mounted in a contact-less manner, e.g., without physically contacting the electric conductor 200.

Additionally or alternatively, the electric conductor 200 may comprise a width w between 10 mm and 20 mm (e.g., 16 mm). The residual portion 203 may comprise a reduced width w, between 5 mm and 10 mm (e.g., 7 mm). This design of the electric conductor 200 may provide for an enhanced behavior of the innovative sensor device 100, in particular with respect to the phase shift and the attenuation of the magnitude over frequency, as will be discussed in more detail further below.

Additionally or alternatively, the cutout portion 211 may comprise a width $w_{CP}$ (to be measured parallel to the length l of the electric conductor 200) between 2 mm and 8 mm (e.g., 4 mm). As descried above, the cutout portion 211 may extend from the first longitudinal side 201 towards the second longitudinal side 202. The cutout portion 211 may extend perpendicular to the length direction of the electric conductor 200, and the cutout portion 211 may extend substantially straight into the middle of the conductor 200. At its end facing the second longitudinal side 202, the cutout portion 211 may comprise a curved section 216. The curved section 216 may comprise a radius between 0.5 mm and 2.5 mm (e.g., 1.5 mm).

FIG. 3C shows a side view onto the first longitudinal side 201 of the electric conductor 200. It shows the cutout portion 211 formed into the first longitudinal side 201, and the magnetic sensor 300 being positioned at the opposite second longitudinal side 202, such that the magnetic sensor 300 faces the cutout portion 211.

As can be seen, the electric conductor 200 may comprise a thickness t to be measured perpendicular to the length l and width w of the electric conductor 200. The electric conductor 200 may comprise a thickness t between 1 mm and 6 mm (e.g., 3 mm).

As can best be seen in FIGS. 3B and 3C, the magnetic sensor 300 may be vertically arranged, e.g., along the thickness direction of the electric conductor 200. Therefore, the magnetic sensor 300 can be arranged such that its sensitive sensing area faces the residual portion 203 and the cutout portion 211, respectively. In other words, the sensitive sensing area of the magnetic sensor 300 may be arranged perpendicular to the flat elongated electric conductor 200, such that the magnetic sensor 300 may be configured to measure magnetic field components $\vec{B}$ being directed perpendicular to a flow direction of the current I flowing through the electric conductor 200. Accordingly, the magnetic sensor 300 may be configured to measure the magnetic field out-of-plane.

In FIGS. 3A to 3C, a coordinate system is depicted. The x-axis corresponds to the length direction of the electric conductor 200, the y-axis corresponds to the thickness direction of the electric conductor 200, and the z-axis corresponds to the width direction of the electric conductor 200. As can be seen, the electric current I flows in x-direction. The magnetic sensor 300 may be arranged such that its sensitive sensing area faces in the z-direction, so as to be able to measure magnetic field components $\vec{B}$ which are also directed in z-direction. For example, the magnetic sensor 300 may be configured as a hall sensor, and in particular as a vertical hall sensor comprising hall elements that are vertically arranged so as to measure the magnetic field out-of-plane in the z-direction.

By positioning the magnetic sensor 300 at one of the longitudinal sides 201, 202 of the electric conductor 200, the field seen by the magnetic sensor 300 increases for higher frequency, which is based on the skin effect. This solves the limitation of the phase shift, which gets too high for massive busbars using "vertical insertion" and "lateral insertion" sensing concepts.

Figure 4:
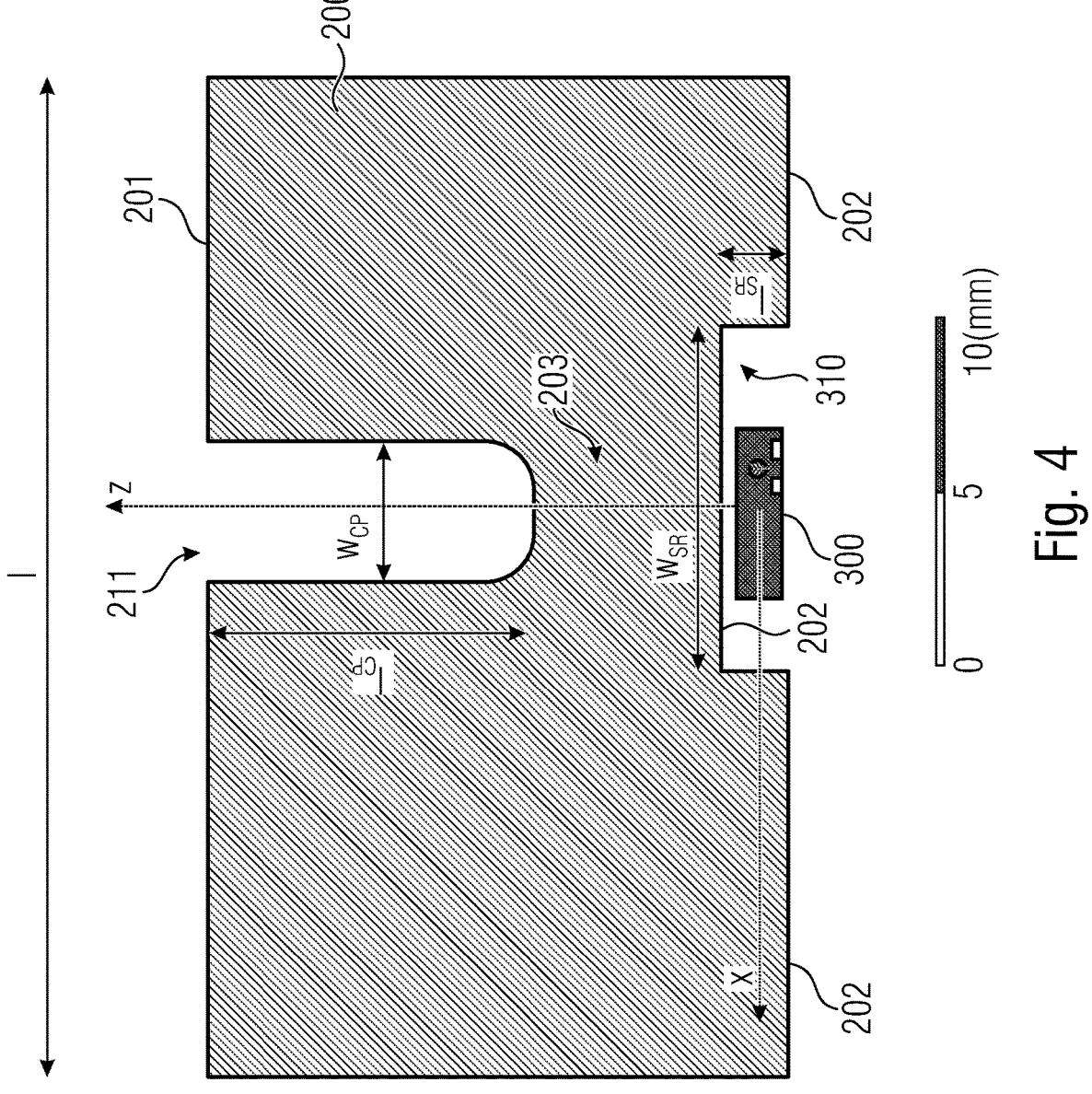
FIG. 4 shows a top view onto a section of a sensor device according to a further implementation.

FIG. 4 shows a further implementation, wherein like elements are referenced with like reference numerals. In addition to the previously discussed implementations, the second longitudinal side 202 (e.g., the longitudinal side opposite the cutout portion 211) may comprise a stepped region 310 in which the second longitudinal side 202 is shifted towards, or moved closer to, the cutout portion 211. The stepped region 310 may be positioned such that the residual portion 203 of the electric conductor 200 may be arranged between the cutout portion 211 and the stepped region 310.

A difference between the cutout portion 211 and the stepped region 310 may be constituted by their respective dimensions. For example, a cutout portion 211 in the sense of this disclosure can be defined in so far as its length $l_{CP}$ exceeds its width $w_{CP}$. In turn, a stepped region 310 in the sense of this disclosure can be defined in so far as its width $w_{SR}$ exceeds its length $l_{SR}$. In this case, the widths $w_{CP}$ and $w_{SR}$ are to be measured parallel to the length l of the electric conductor 200, while the lengths $l_{CP}$ and $l_{SR}$ are to be measured perpendicular to the length l of the electric conductor 200.

The stepped region 310 may form some sort of recess in which the magnetic sensor 300 may be accommodated. Even though the magnetic sensor 300 is moved closer to the cutout portion 211 in this way, the magnetic sensor 300 is still arranged next to the (stepped) second longitudinal side 202 of the electric conductor 200. This may provide a proper solution for mounting the magnetic sensor 300 if the available mounting space is limited. Furthermore, this may provide for a protective mounting position such that the magnetic sensor 300 may be protected from externally applied forces.

Figure 5A:
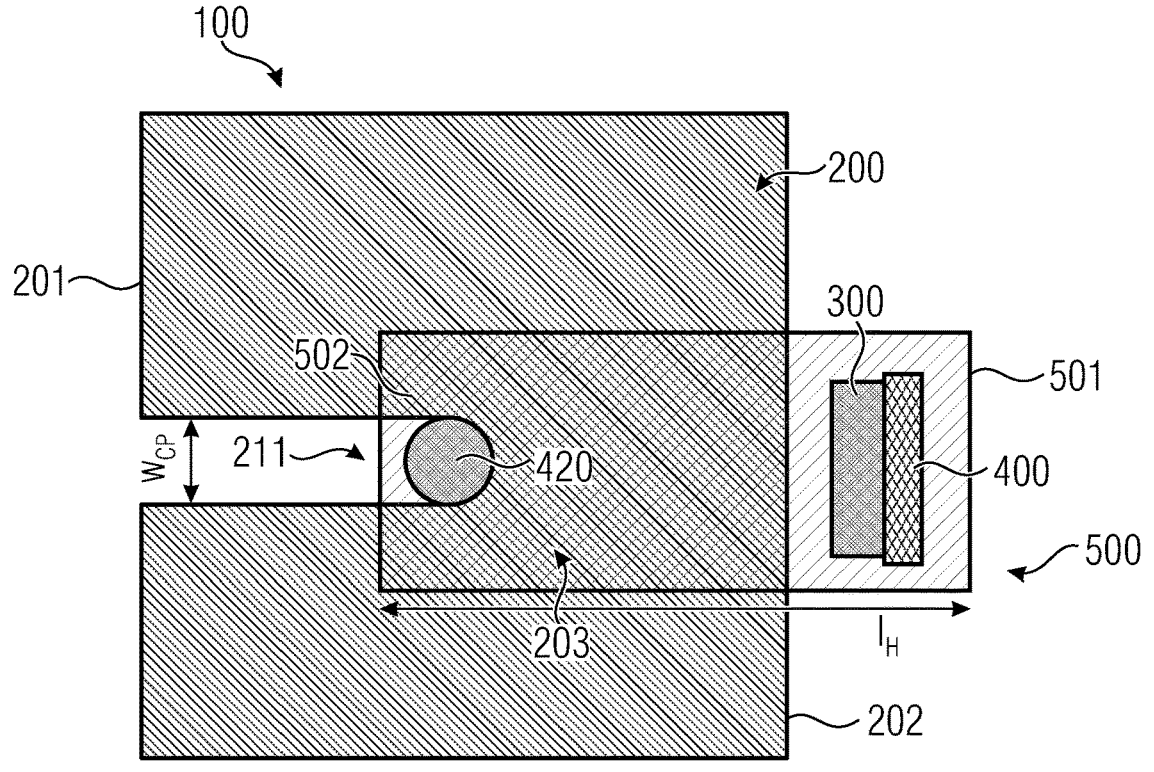
FIG. 5A shows a top view onto a section of a sensor device according to a further implementation.
Figure 5B:
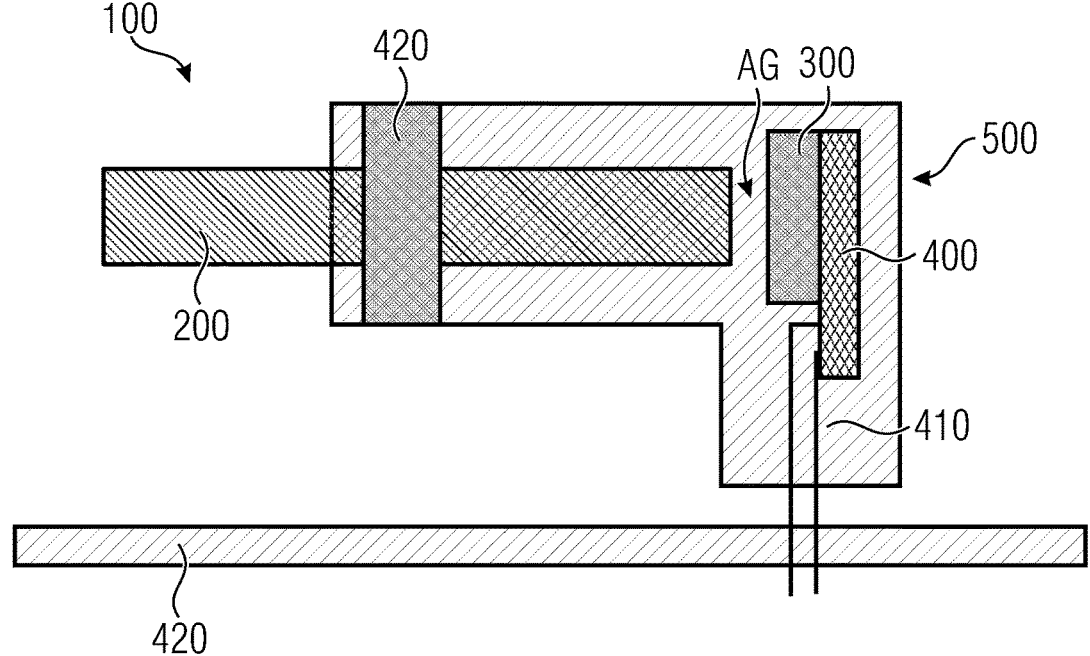
FIG. 5B shows a side view of the sensor device of FIG. 5A.

FIGS. 5A and 5B show further implementations of the sensor device 100 according to the herein described innovative concept. FIG. 5A shows a top view onto the a section of the electric conductor 200 with the magnetic sensor 300 being attached to the electric conductor 200. FIG. 5B shows a side view of the arrangement depicted in FIG. 5A.

In this implementation, the magnetic sensor 300 may be arranged inside a housing 500. The housing 500 may be fastened to the electric conductor 200, for instance, using a fastening member 420. The fastening member 420 may be configured as a bolt, a screw, a press-fit element, a form-fit element, or the like.

The housing 500 may be positioned at the second longitudinal side 202 of the electric conductor 200, e.g., at that one longitudinal side that is opposite the cutout portion 211, which corresponds to that longitudinal side that does not comprise the cutout portion 211.

The housing 500 may comprise a length $l_H$ (measured perpendicular to the length l of the electric conductor 200) such that the housing 500 spans over the narrowed residual portion 203 and, at least partly, over the cutout portion 211. In other words, the housing 500 may cover the narrowed residual portion 203 and, at least partly, the cutout portion 211.

At its one end 501, the housing 500 may carry the magnetic sensor 300. At its opposite other end 502, the housing 500 may carry the fastening member 420. The fastening member 420 may vertically (e.g., perpendicular to the length direction of the electric conductor 200) extend completely through the housing 500. The fastening member 420 may also extend completely through the electric conductor 200, and in particular completely through the cutout portion 211 provided in the electric conductor 200. In this way, the fastening member 420 fastens the housing 500 to the electric conductor 200.

The fastening member 420 may comprise one or more snap-fit elements that are configured to securely engage with the cutout portion 211 in a form-fit manner. For example, an outer diameter of the fastening member 420 may be substantially as large as (or a little bit smaller than) the width $w_{CP}$ of the cutout portion 211. The width $w_{CP}$ of the cutout portion 211 is to be measured in the same direction as the length l of the electric conductor 200. Accordingly, the housing can be securely snap-fitted into the cutout portion 211 to be securely engaged with the same, such that the housing 500 is fixed to the electric conductor 200.

The housing 500 may comprise dimensions, and in particular a housing length $l_H$, that is to be measured along the width direction of the electric conductor 200. The housing length $l_H$ may be configured such that the integrated magnetic sensor 300 is positioned at a fixed and predetermined distance from the second longitudinal side 202 of the electric conductor 200, in a state when the housing 500 is fixed to the electric conductor 200. This distance between the magnetic sensor 300 and the electric conductor 200 corresponds to the above discussed air gap AG. Accordingly, since the magnetic sensor 300 is arranged inside the housing 500, the housing 500 may position the magnetic sensor 300 with a fixed and predetermined air gap relative to the electric conductor 200.

The magnetic sensor 300 may be mounted on a substrate 400, e.g., a printed circuit board—PCB. The substrate 400 may optionally be arranged inside the housing 500. The magnetic sensor 500 or the substrate 400 may be galvanically connected with a component carrier 420, e.g., using electrical conductors 410, such as wires or cables like flat ribbon cables. The component carrier 420 may also be configured as a PCB.

FIGS. 6A to 6D show some further implementations of the sensor device 100 according to the herein described innovative concept. In these implementations, the housing 500 may be partitioned into two parts.

For example, the housing 500 may comprise a main body part 501, in which the magnetic sensor 300 may be accommodated, as described before. Additionally, the housing 500 may comprise a prong part 502 (FIG. 6B), 502' (FIG. 6D) that may be removably attached to the main body part 501.

Figure 6A:
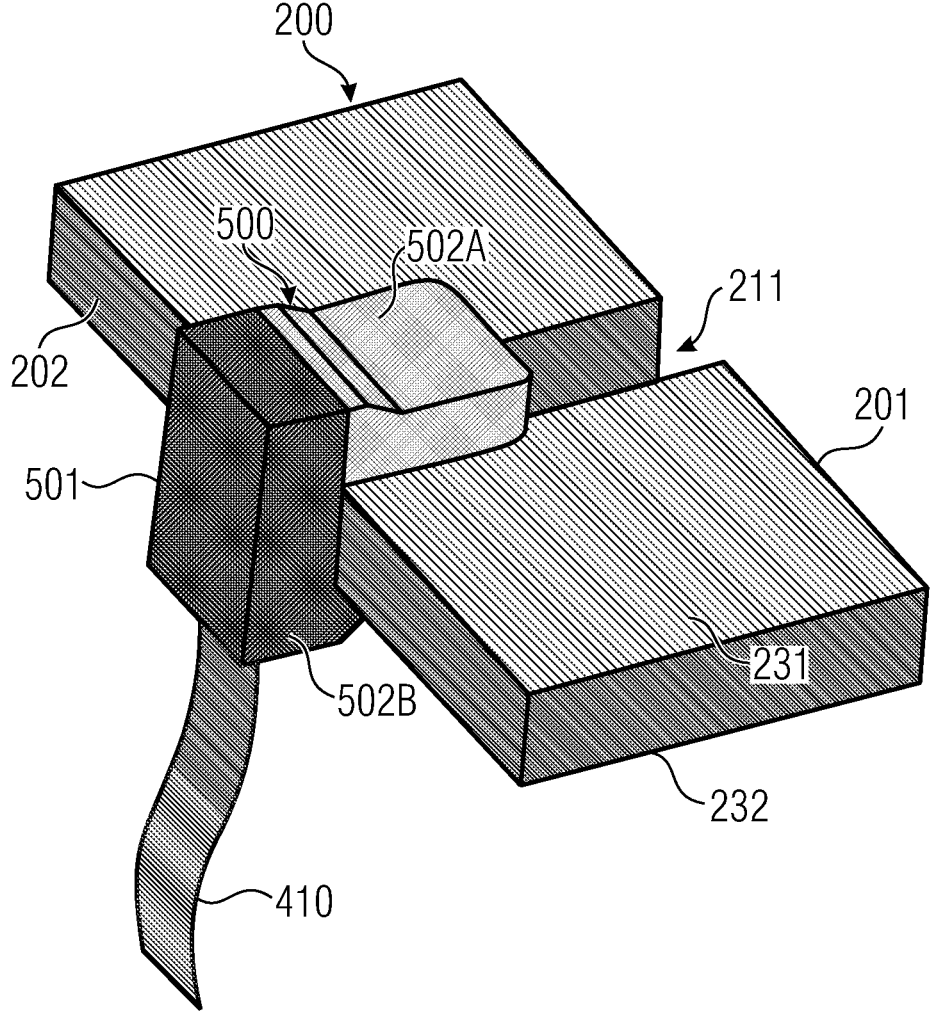
FIG. 6A shows a top perspective view onto a sensor device according to a further implementation.
Figure 6B:
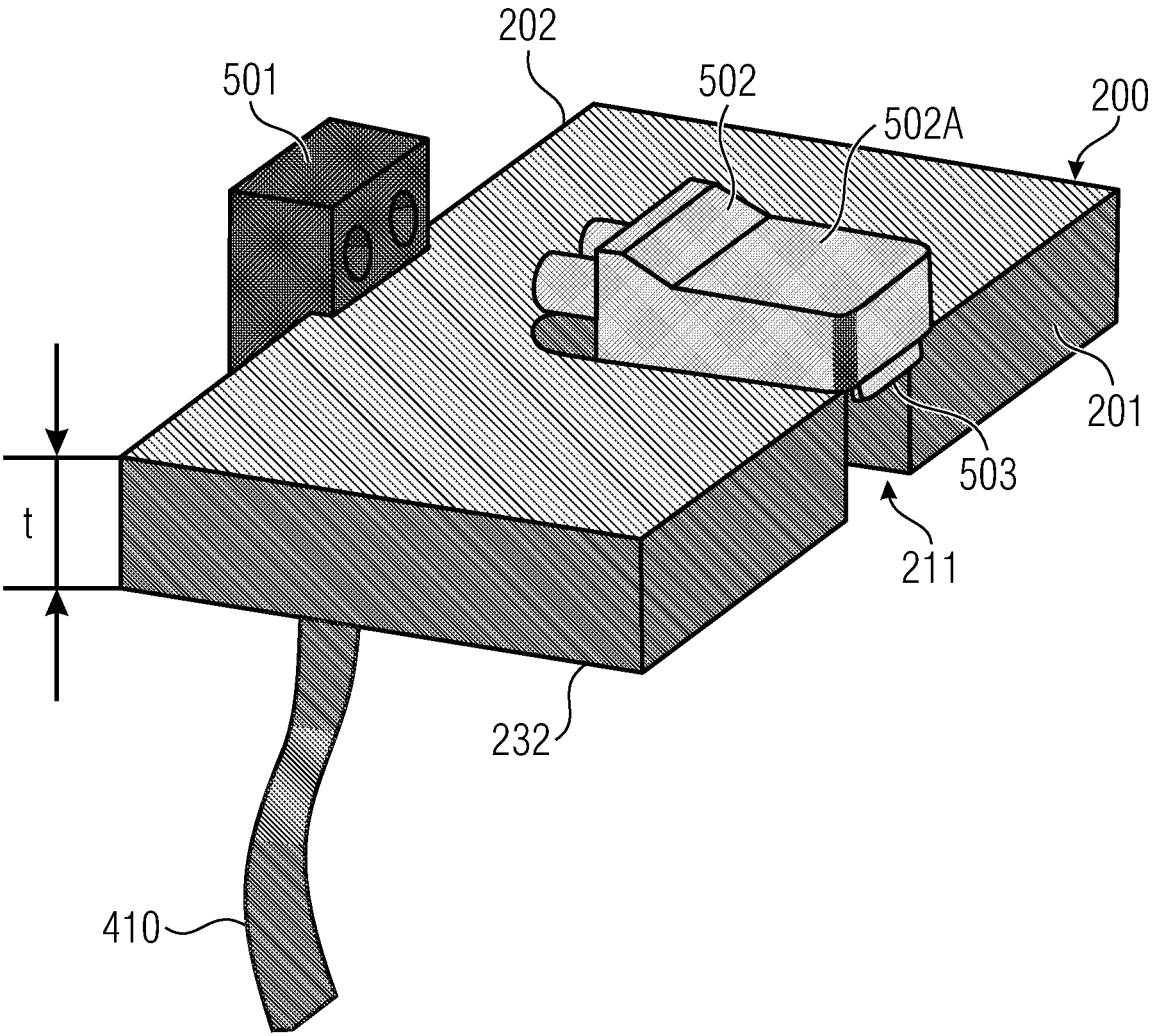
FIG. 6B shows a further top perspective view onto the sensor device of FIG. 6A.
Figure 6C:
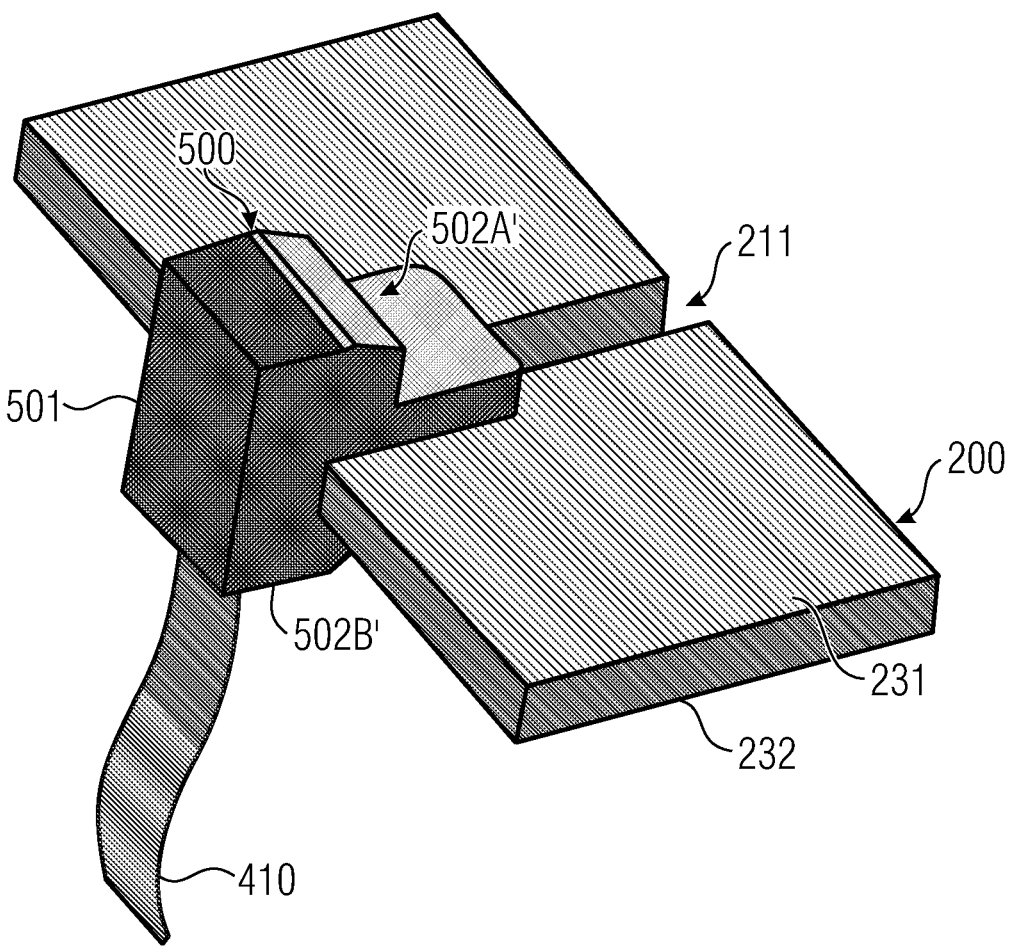
FIG. 6C shows a top perspective view onto a sensor device according to a further implementation.
Figure 6D:
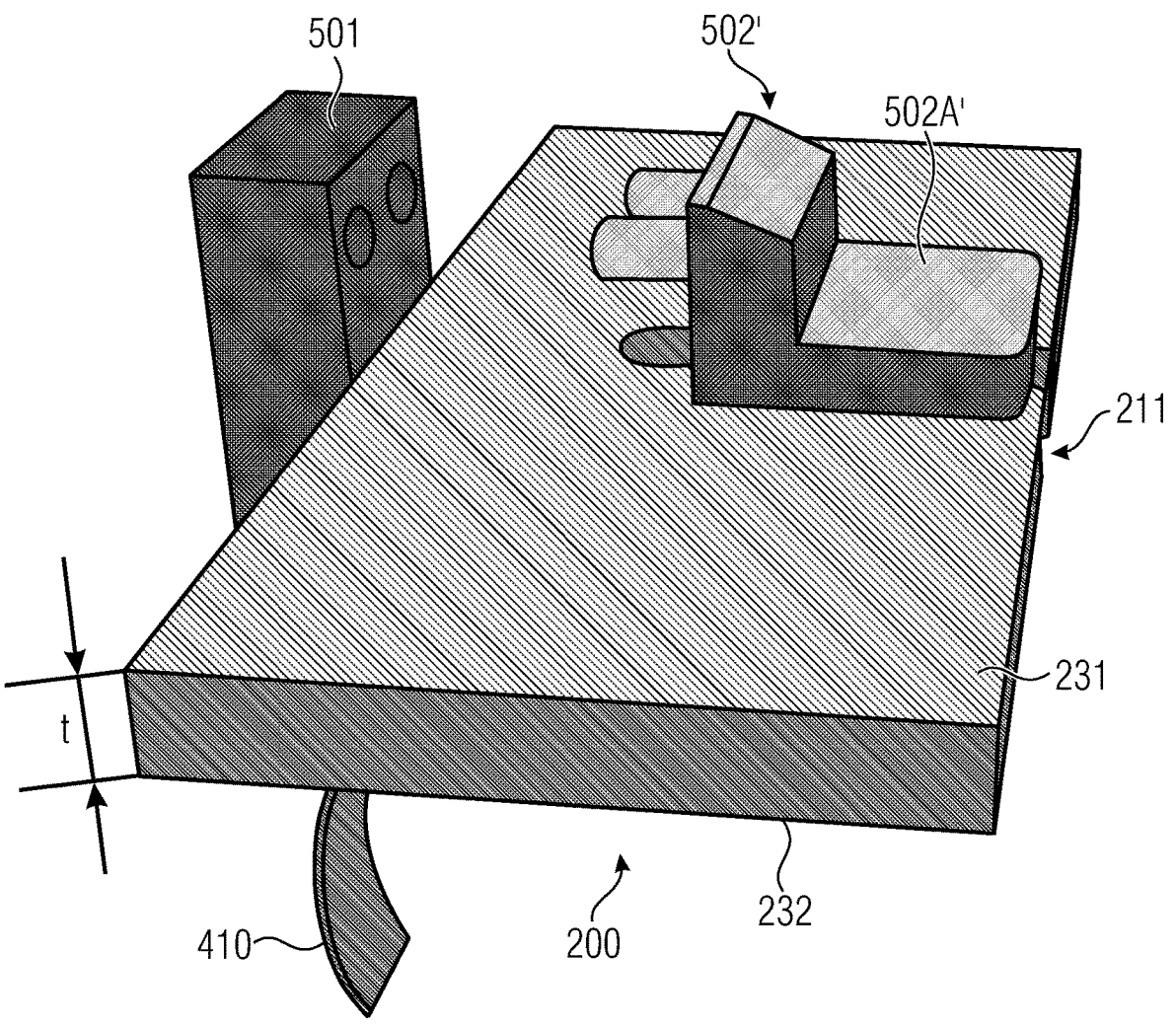
FIG. 6D shows a further top perspective view onto the sensor device of FIG. 6C.

Each prong part 502, 502' may comprise two oppositely arranged prongs 502A, 502B (FIGS. 6A, 6B); 502A', 502B' (FIGS. 6C, 6D). For the sake of clarity, only the prong part 502 and its prongs 502A, 502B as depicted in FIGS. 6A and 6B will now be described in more detail. However, every described feature and functionality also applies to the prong part 502'' and its prongs 502A', 502B' as depicted in FIGS. 6C and 6D.

The prong part 502 has a clamp-like structure and comprises two oppositely arranged prongs 502A, 502B, wherein a first prong 502A may be positioned at a first (e.g., top) surface 231 of the electric conductor 200, while a second prong 502B may be positioned at the opposite second (e.g., bottom) surface 232 of the electric conductor 200. Accordingly, the electric conductor 200 is insertable between the two oppositely arranged prongs 502A, 502B in a form fit manner. In other words, the electric conductor 200 may be sandwiched between the two oppositely arranged prongs 502A, 502B.

The two prongs 502A, 502B at the top and bottom surface 231, 232 may each comprise the same geometrical shape. Furthermore, the two prongs 502A, 502B may each comprise a fastening member, as described above, wherein the fastening member may comprise a snap-fit element 503 (FIG. 6B), for example. The snap-fit element 503 may be arranged at surface of the prongs 502A, 502B, which faces the respective surface 231, 232 of the electric conductor 200. For example, the snap-fit element 503 may be arranged at the tips of the prongs 502A, 502B. At least one of the prongs, or both prongs 502A, 502B, may comprise the snap-fit element 503. The snap-fit element 503 may securely engage with the cutout portion 211, as described above.

The prongs 502A, 502B of the prong part 502 may be detachably connected to the main body part 501. Accordingly, the prongs 502A, 502B may be replaceable. Thus, the prongs 502A, 502B can be used as replaceable adaptors for electric conductors 200 having different thicknesses.

For example, the electric conductor 200 of FIGS. 6A and 6B may have a larger thickness t (e.g., 5 mm) than the thickness t (e.g., 3 mm) of the electric conductor 200 shown in FIGS. 6C and 6D. Thus, the two prongs 502A, 502B intended for the thicker conductor 200 (FIGS. 6A, 6B) may comprise a first clear span (e.g., vertical distance between each other) that is larger than a second clear span between the two prongs 502A', 502B' intended for the thinner conductor 200 (FIGS. 6C, 6D). In general, the clear span between two prongs 502A, 502B; 502A', 502B' may correspond to the thickness t of the respective conductor 200 that is to be fitted between the respective two prongs 502A, 502B; 502A', 502B'.

Accordingly, implementations of the present innovative concept may provide for a housing 500 comprising a first set of replaceable prongs 502A, 502B configured to accommodate an electric conductor 200 having a first thickness, and a second set of replaceable prongs 502A', 502B' being configured to accommodate an electric conductor 200 having a different second thickness.

The main body part 501, however, may always comprise the same dimensions, be it for a thicker or a thinner conductor 200. This makes it easy to produce one and the same main body part 501, which may always carry the magnetic sensor 300 inside, such that an universal main body part 501 can be used for different conductors 200 having different thicknesses.

Figure 6E:
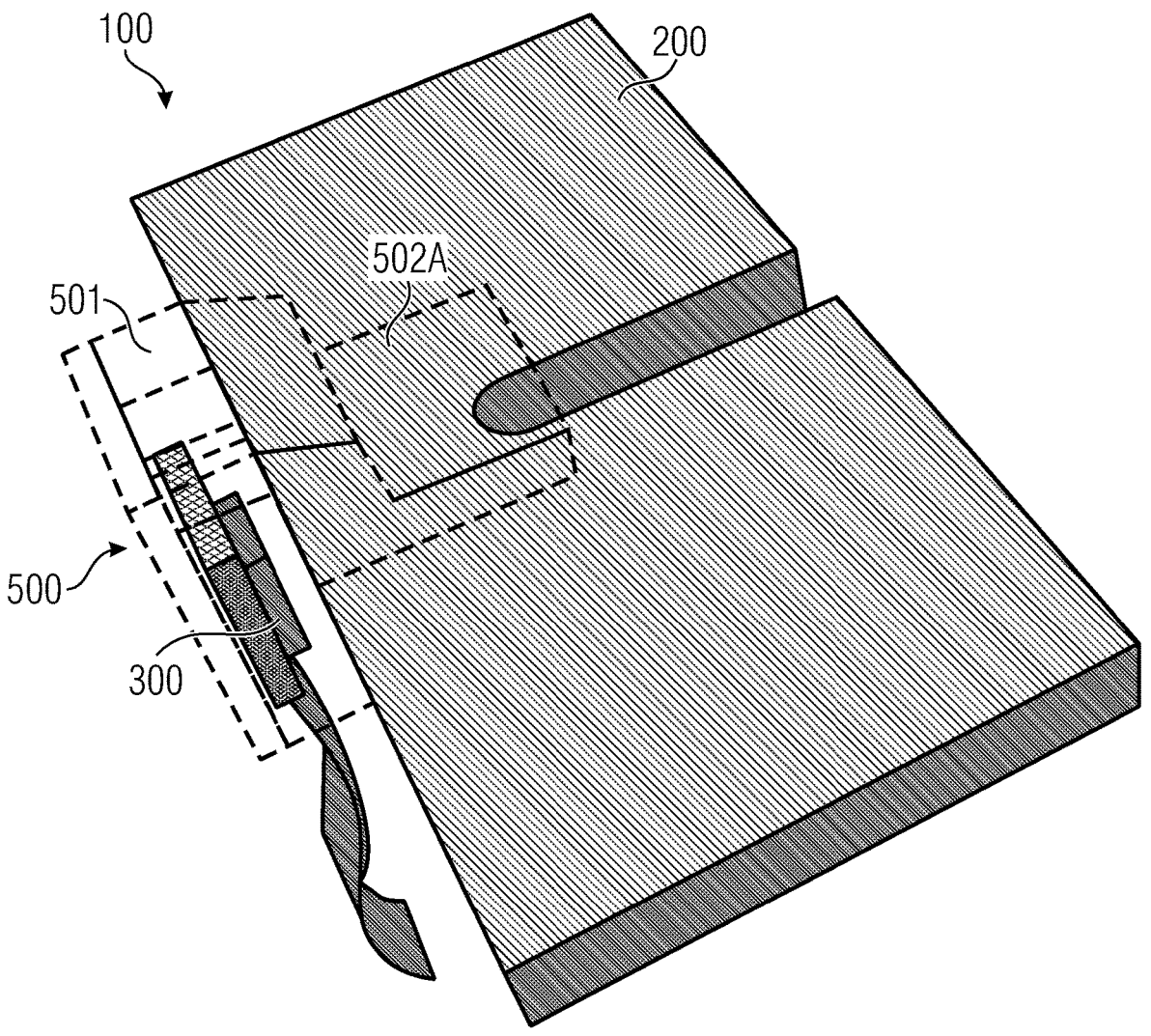
FIG. 6E shows a top perspective view onto a sensor device according to a further implementation.
Figure 6F:
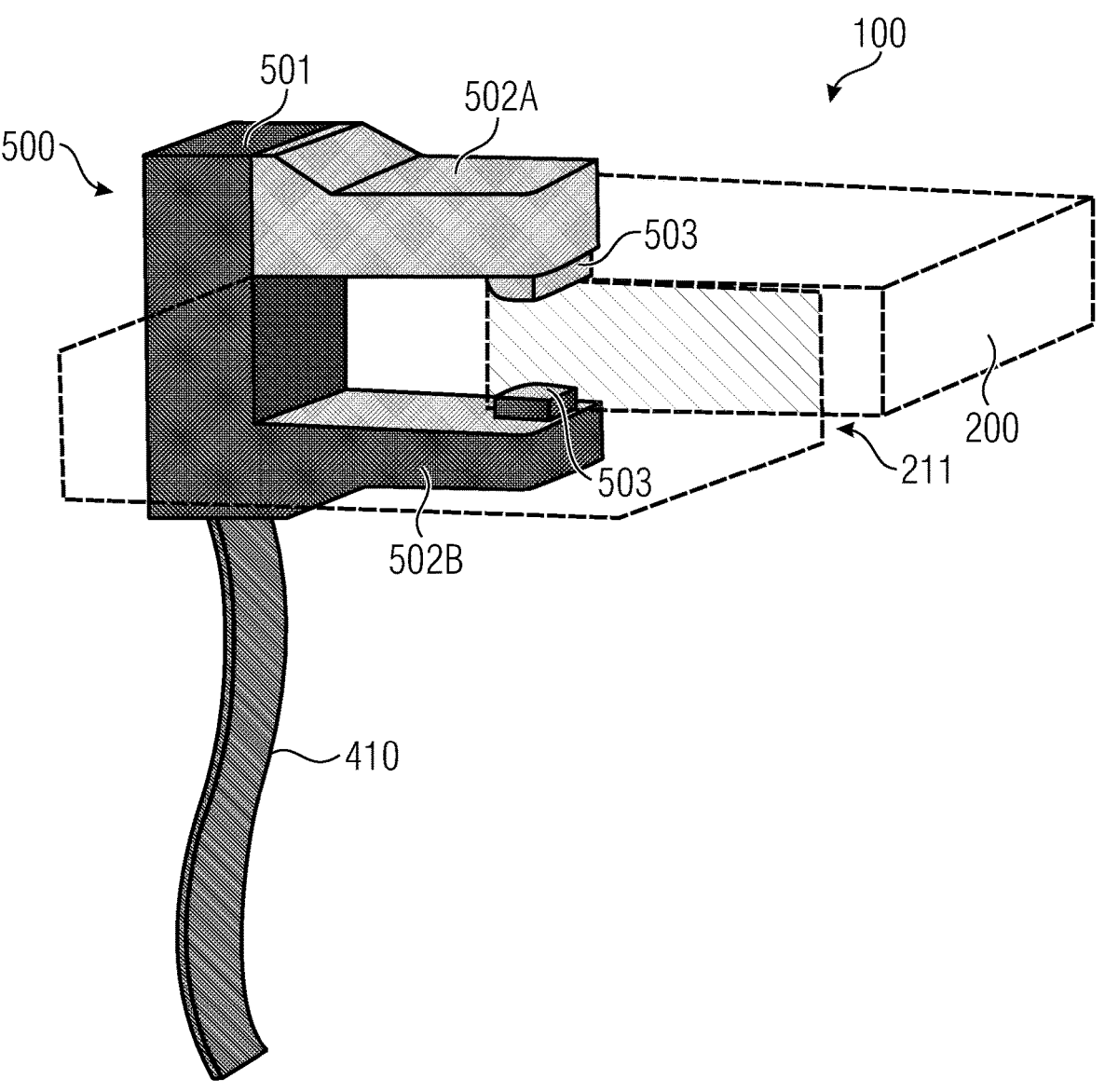
FIG. 6F shows a top perspective view onto a sensor device according to a further implementation.

FIGS. 6E and 6F show some further views, wherein in FIG. 6E the housing 500 is represented semi-transparent using outlines drawn in dashed lines, and wherein in FIG. 6F the electric conductor 200 is represented semi-transparent using outlines drawn in dashed lines.

As can be seen in FIG. 6E, the magnetic sensor 300 may be arranged inside the main body part 501 of the housing 500. The removable prongs 502A, 502B may be attached to the main body part 501 such that the electric conductor 200 is sandwiched between those two prongs 502A, 502B.

These prongs 502A, 502B are more clearly depicted in FIG. 6F. As described above, each of the prongs 502A, 502B may comprise a snap-fit element 503 that may, for instance, be attached at the tip of each prong 502A, 502B. The snap-fit elements 503 may protrude into the cutout portion 211 formed in the electric conductor 200. Thus, the snap-fit elements 503 may securely engage with the cutout portion 211 for fixedly fastening the housing 500 to the electric conductor 200.

As mentioned above, for high power applications, the size of the electric conductor 200 needs to be increased in order to reach a desired resistance value (e.g., 5 μOhm or less). However, an increased conductor size leads to an undesired increase in phase shift and an undesired attenuation of the magnitude over frequency.

The present innovative concept solves this trade-off, by providing an electric conductor 200 having a desired insertion resistance of 5 Ohm or less, but at the same comprising small dimensions such that a phase shift remains small (e.g., at 4° or less) and an attenuation of the magnitude stays at or below an acceptable level. A proof of concept has been established using FEM simulations, wherein the simulation results shall be briefly discussed in the following.

The FEM simulations were made to evaluate the performance of the present concept in terms of transfer factor, insertion resistance, bandwidth and sensor displacement effects. The present concept was compared to the "lateral insertion" arrangement and the "vertical insertion" arrangement, which were previously discussed with reference to FIGS. 2A and 2B. In the following figures, the present innovative concept may also be referred to as "vertical side" sensing, since the magnetic sensor 300 may be arranged vertically at a longitudinal side 201, 202 of the electric conductor 200, in a way as discussed above.

All of the herein discussed implementations may be configured such that the electric conductor 200 may comprise at least one of the following dimensions:

a width w between 10 mm and 60 mm;
a thickness t between 2 mm and 8 mm.

Furthermore, the residual portion 203 of the electric conductor 200 may have a reduced width $w_r$ between 3 mm and 12 mm.

These non-limiting design options may result in an insertion resistance of 5 μOhm und a transfer factor of 11.78 μT/A.

For comparison reasons, in particular with respect to bandwidth for the same power dissipation limit, a "lateral insertion" arrangement and a "vertical insertion" arrangement were FEM-configured, both arrangements introducing the same insertion resistance of 5 μOhm. Summarizing, the design of the present concept results in:
a transfer factor of 11.78 μT/A
an insertion resistance of 5 μOhm
the design of an equivalent "lateral insertion" results in:
a transfer factor of 16.08 μT/A
an insertion resistance of 5 μOhm
the design of an equivalent "vertical insertion" results in:
a transfer factor of 20.39 μT/A
an insertion resistance of 5 μOhm As can be seen at first glance, the transfer factor of the present innovative concept may be lower compared to the equivalent "lateral insertion" and "vertical insertion" arrangements. However, this may be the only lower performance of the present innovative concept. But this is not an issue for high power applications, since a high full scale range is needed and, therefore, a lower sensitivity is fully acceptable.

However, in terms of magnitude attenuation and phase shift over frequency, the present innovative concept is significantly favorable over "lateral insertion" and "vertical insertion" arrangements, which shall be discussed in the following.

It is to be noted that the scales and numbers used in the following figures and corresponding description are only non-limiting examples in order to show the differences between the present innovative concept and the "lateral insertion" and "vertical insertion" arrangements. Accordingly, the following example numbers and scales are not to be construed as limiting in any way.

Figure 7:
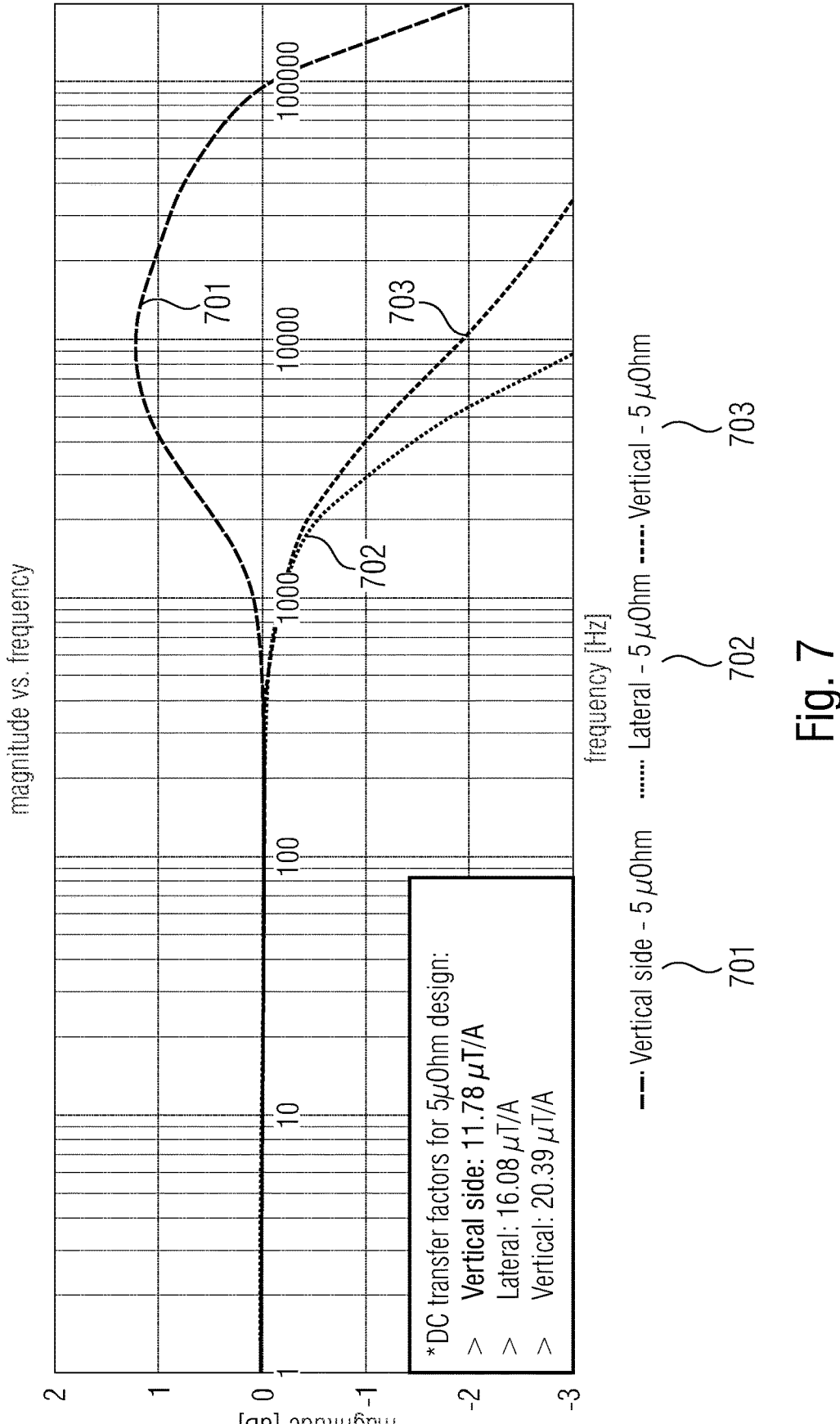
FIG. 7 shows a graph representing the attenuation of the magnitude over frequency.

FIG. 7 shows the attenuation of the magnitude over frequency, wherein the sensor device 100 of the present concept (graph 701) is compared to the "lateral insertion" equivalent (graph 702) and the "vertical insertion" equivalent (graph 703), each at an example and non-limiting insertion resistance of 5 μOhm.

As can be seen in graphs 702, 703, the attenuation of the magnitude of the "lateral insertion" and "vertical insertion" arrangements begins at around 500 Hz. At the same frequency, the graph 701 shows that the sensor device 100 of the present innovative concept has an increase in magnitude with increasing frequency, while a decrease/attenuation begins at around 100 kHz. However, this overshoot of the frequency response between around 1 kHz and 100 kHz can be tuned with a low pass filter inserted on the output of the magnetic sensor 300. Filtering may be performed in any case in order to reduce noise, so this overshoot is not representing a drawback.

Figure 8:
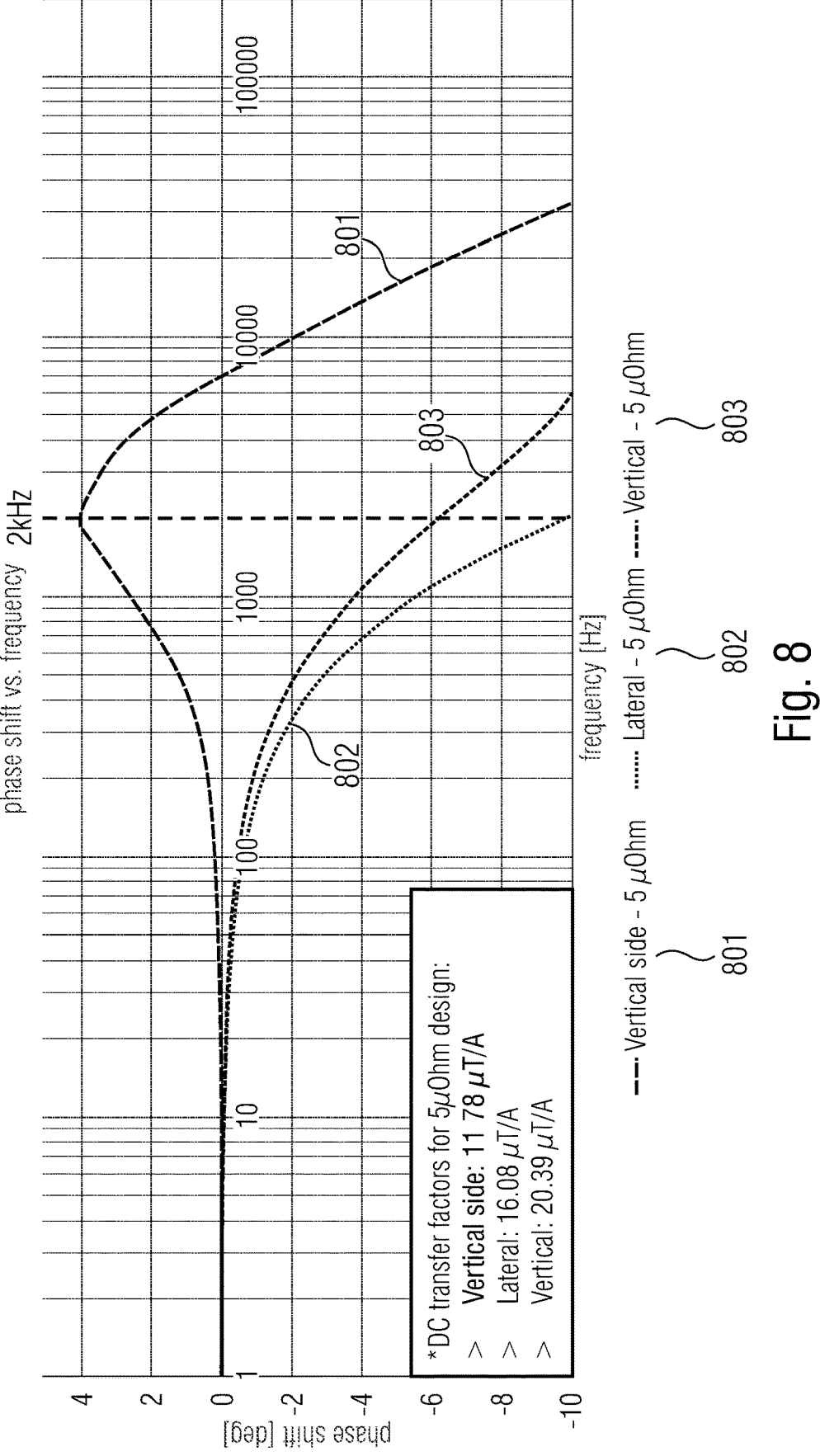
FIG. 8 shows a graph representing the phase shift over frequency.

FIG. 8 shows the phase shift over frequency, wherein the sensor device 100 of the present concept (graph 801) is again compared to the "lateral insertion" equivalent (graph 802) and the "vertical insertion" equivalent (graph 803), each at an example and non-limiting insertion resistance of 5 μOhm.

As can be seen in graph 801, the sensor device 100 of the present concept provides for a maximum phase shift of only 4° at a frequency of 2 kHz. In contrast, the "lateral insertion" equivalent shows a phase shift of −10° at 2 kHz, as represented by graph 802, and the "vertical insertion" equivalent shows a phase shift of more than −6° at 2 kHz, as represented by graph 803. Accordingly, the sensor device 100 of the present innovative concept has a considerably smaller phase shift. Thus, the present innovative concept is competitive against core-based current sensing solutions.

Figure 9A:
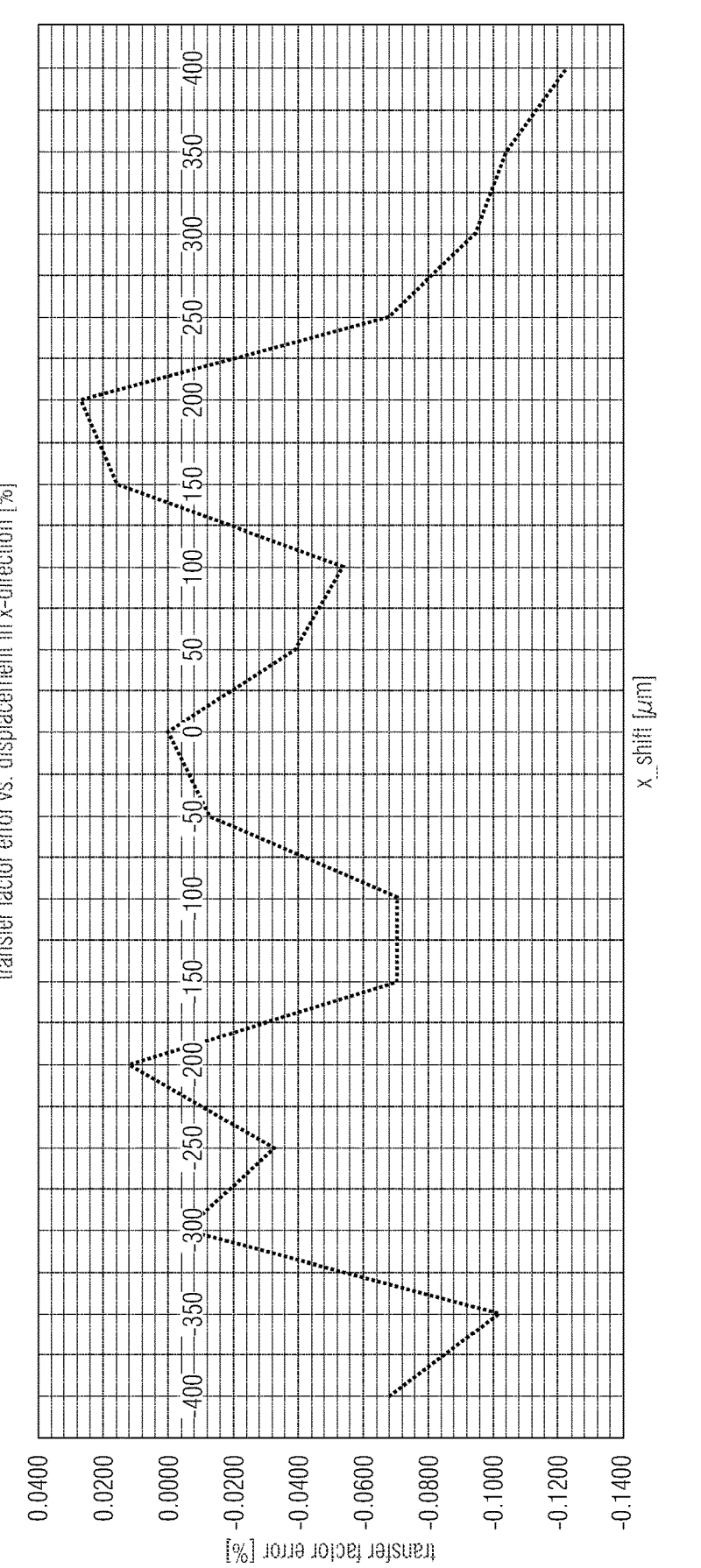
FIG. 9A shows a graph representing the transfer factor error versus displacement of the magnetic sensor in x-direction.
Figure 9B:
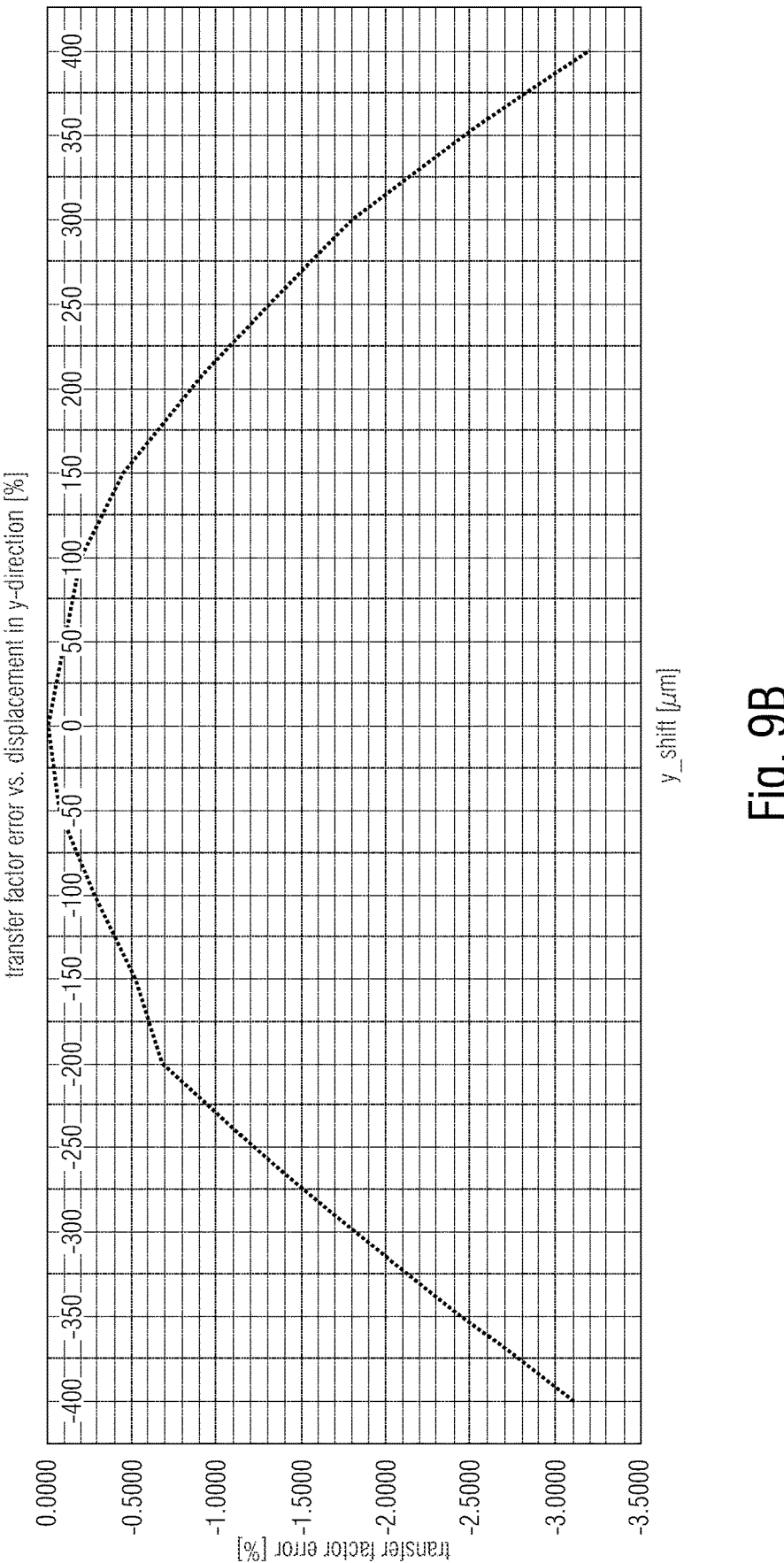
FIG. 9B shows a graph representing the transfer factor error versus displacement of the magnetic sensor in y-direction.
Figure 9C:
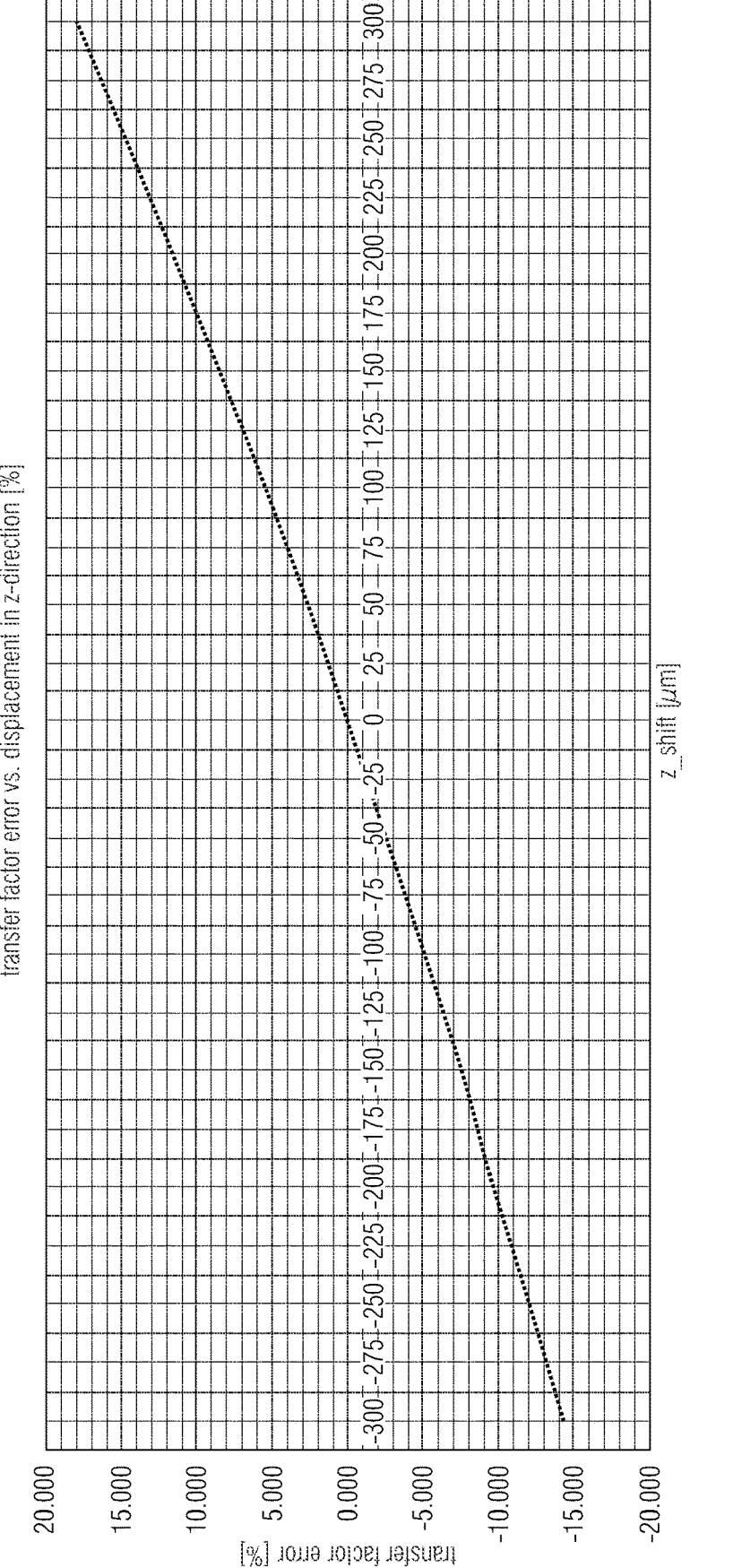
FIG. 9C shows a graph representing the transfer factor error versus displacement of the magnetic sensor in z-direction.

FIGS. 9A, 9B and 9C each show a transfer factor error as a function of a displacement of the magnetic sensor 300 relative to the electric conductor 200. In this regard, FIG. 9A shows the transfer factor error in case the magnetic sensor 300 is translationally moved in a positive and negative x-direction (referring to a coordinate system as introduced with reference to FIGS. 3A to 4). A movement in the x-direction corresponds to a movement along the length l of the electric conductor 200 (left/right movement). As can be seen in FIG. 9A, the transfer factor error varies only by a small amount, e.g., between 0.02% and –0.1%, over a total displacement range of 800 μm (–400 μm<x<+400 μm).

FIG. 9B shows the transfer factor error in case the magnetic sensor 300 is translationally moved in a positive and negative y-direction (referring to the coordinate system as introduced with reference to FIGS. 3A to 4). A movement in the y-direction corresponds to a movement along the thickness direction of the electric conductor 200 (up/down movement). As can be seen in FIG. 9B, the transfer factor error again varies only by a small amount of around 3.0% over the entire displacement range of 800 μm (–400 μm<y<+400 μm).

FIG. 9C shows the transfer factor error in case the magnetic sensor 300 is translationally moved in a positive and negative z-direction (referring to the coordinate system as introduced with reference to FIGS. 3A to 4). A movement in the z-direction corresponds to a movement along the width direction of the electric conductor 200 (forward/rearward movement). This may correspond to an increase and decrease of the above described air gap, respectively. As can be seen in FIG. 9C, the transfer factor error varies between –14% and +17%, over a total displacement range of 600 μm (–300 μm<z<+300 μm).

Accordingly, increasing and decreasing the air gap, e.g., a translational movement into the z-direction, may have the biggest impact on the transfer factor error. However, regarding the air gap, the magnetic sensor 300 can be positioned with high precision into a fixed position relative to the electric conductor 200. This may be accomplished, for instance, using the above described clamp-like housing 500. Thus, this transfer factor error plays a rather secondary role.

In contrast, the translational movements in x- and y-directions do not have a severe impact on the transfer factor. Thus, the magnetic sensor 300 can be arranged with a relatively high mounting tolerance next to the electric conductor 200. This may simplify the mounting process, which leads to significantly reduced production costs.

Summarizing, the herein presented innovative "vertical side" sensing structure 100 provides a much better phase shift for the same power losses compared to "vertical insertion" and "lateral insertion" arrangements. Further, the innovative "vertical side" sensing structure 100 can achieve a lower insertion resistance and a better frequency response performance compared to currently used "vertical insertion" and "lateral insertion" sensing structures in high power applications. Yet further, the integration into a sensor module can be done in a much easier way by using the innovative "vertical side" concept. The herein described innovative concept further provides a design optimization for maintaining mechanical robustness.

Furthermore, the innovative "vertical side" sensing concept solves the drawback of existing solutions for high power applications. It achieves a much lower insertion resistance and a better frequency response performance, in particular for busbar thicknesses of 2.5 mm or less compared to "lateral insertion" and "vertical insertion" arrangements.

Yet further, the transfer factor is stable enough even when the magnetic sensor 300 is displaced. This allows for the required mechanical tolerances in assembly lines. The frequency response is stable even in case of sensor displacement.

The present innovative concept allows to use coreless sensors 300 even for high power applications, which was not possible before due to the limitation of the high insertion resistance of "lateral insertion" and "vertical insertion" arrangements. Even though the above description of the non-limiting examples and implementations referred to coreless magnetic sensors, it is also possible to use magnetic sensors instead, which may comprise a ferrous core acting as a field concentrator.

The magnetic sensor 300 may be configured as a hall sensor. In this case, the present disclosure may suggest a "vertical side" sensing structure for hall-based external current rail sensors. Hall sensors are well established and available at reasonable costs. Therefore, the herein presented innovative sensor concept can be easily manufactured at low production costs.

The innovative "vertical side" sensing concept can be used in high power inverter environments, e.g., medium and high power drives in the field of automotive or other branches of industry. The herein described innovative current sensor device 100 may be applied in main inverter applications in the automotive industry or in other industry fields concerning high power applications. For example, the herein described high accurate current sensing of a drive inverter of electronic vehicles has a direct impact on the efficiency of the inverter that leads directly to a $CO_2$ reduction.

The innovative current sensor device 100 may be applied in many different applications, such as:

Battery monitoring systems

Battery Management

Power Distribution Systems

Battery Disconnect switches

E-Fuses

Power Inverters

Etc.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

While this disclosure has been described with reference to illustrative implementations, this description is not intended to be construed in a limiting sense. Various modifications and combinations of the illustrative implementations, as well as other implementations of this disclosure, will be apparent to persons skilled in the art upon reference to the description. It is therefore intended that the appended claims encompass any such modifications or implementations.

The invention claimed is:

1. A sensor device comprising:

an electric conductor comprising:

a flat elongated shape having a thickness, a width, and a length, wherein the electric conductor is configured to conduct an electric current along the length of the electric conductor, and at least one cutout portion extending along the width of the electric conductor, the at least one cutout portion extending from a first longitudinal side of the electric conductor towards an opposite second longitudinal side of the electric conductor, wherein a residual portion of the electric conductor remains between the at least one cutout portion and the opposite second longitudinal side of the electric conductor; and a magnetic sensor configured to measure a magnetic field emanating from the electric current flowing through the electric conductor, wherein the magnetic sensor is arranged next to the electric conductor laterally opposite the at least one cutout portion, wherein a residual portion of the electric conductor is arranged laterally between the at least one cutout portion and the magnetic sensor.

2. The sensor device of claim 1, wherein the at least one cutout portion is a single-sided cutout portion that is provided at only one of the first longitudinal side or the opposite second longitudinal side.

3. The sensor device of claim 1, wherein the magnetic sensor is spatially separated from the electric conductor such that an air gap remains between the magnetic sensor and the electric conductor.

4. The sensor device of claim 3, wherein the air gap is between 0.1 mm and 1.5 mm.

5. The sensor device of claim 1, wherein the residual portion of the electric conductor, the magnetic sensor, and the at least one cutout portion are arranged in a same plane.

6. The sensor device of claim 1, wherein the magnetic sensor comprises a sensing area that faces the at least one cutout portion.

7. The sensor device of claim 6, wherein the sensing area of the magnetic sensor is arranged perpendicular to the electric conductor, and wherein the magnetic sensor is configured to measure magnetic field components being directed perpendicular to a flow direction of the current flowing through the electric conductor.

8. The sensor device of claim 1, wherein the magnetic sensor is configured as a Hall sensor.

9. The sensor device of claim 1, wherein the magnetic sensor is arranged inside a housing being externally attached to the electric conductor.

10. The sensor device of claim 9, wherein the housing comprises a fastening member configured to fasten the housing to the electric conductor.

11. The sensor device of claim 10, wherein the fastening member comprises one or more snap-fit elements that are configured to securely engage with the at least one cutout portion.

12. The sensor device of claim 10, wherein the fastening member extends through the at least one cutout portion.

13. The sensor device of claim 9, wherein the housing comprises a structure comprising two prongs between which the electric conductor is insertable in a form fit manner.

14. The sensor device of claim 13, wherein the magnetic sensor is arranged inside a main body part of the housing, and wherein the two prongs are detachably connected to the main body part.

15. The sensor device of claim 1, wherein the electric conductor comprises at least one of:

a width between 10 mm and 60 mm, or a thickness between 2 mm and 8 mm.

16. The sensor device of claim 1, wherein the residual portion of the electric conductor is configured to provide an electric resistance of 5 µΩ or less.

17. The sensor device of claim 1, wherein the residual portion of the electric conductor has a width between 3 mm and 12 mm.

18. The sensor device of claim 1, wherein the electric conductor is configured for high power applications fulfilling at least one of the following conditions:

an electric voltage of U>500V, or an electric current of I>200 A.

19. The sensor device of claim 1, wherein the magnetic sensor shows a frequency response having a phase shift of 4° or less at a current frequency greater than, or equal to, 1.5 kHz.

20. A sensor device comprising:

an electric conductor comprising:

a flat elongated shape having a thickness, a width, and a length, wherein the electric conductor is configured to conduct an electric current along the length of the electric conductor, and at least one cutout portion extending along the width of the electric conductor, the at least one cutout portion extending from a first longitudinal side of the electric conductor towards an opposite second longitudinal side of the electric conductor, wherein a residual portion of the electric conductor remains between the at least one cutout portion and the opposite second longitudinal side of the electric conductor; and a magnetic sensor configured to measure a magnetic field emanating from the electric current flowing through the electric conductor, wherein the magnetic sensor is arranged next to the electric conductor opposite the at least one cutout portion, wherein the opposite second longitudinal side comprises a stepped region provided opposite the at least one cutout portion such that the opposite second longitudinal side is moved closer to the at least one cutout portion, wherein the residual portion of the electric conductor is arranged between the at least one cutout portion and the stepped region, and wherein the magnetic sensor is accommodated inside the stepped region.

* * * * *